United States Patent
Gorobets et al.

(10) Patent No.: US 7,490,283 B2
(45) Date of Patent: Feb. 10, 2009

(54) PIPELINED DATA RELOCATION AND IMPROVED CHIP ARCHITECTURES

(75) Inventors: Sergey Anatolievich Gorobets, Edinburgh (GB); Kevin M. Conley, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 506 days.

(21) Appl. No.: 10/846,289

(22) Filed: May 13, 2004

(65) Prior Publication Data

US 2005/0257120 A1    Nov. 17, 2005

(51) Int. Cl.
G06F 3/00      (2006.01)
G11C 29/00    (2006.01)

(52) U.S. Cl. ...................................................... 714/763
(58) Field of Classification Search ................. 714/763, 714/11; 360/53; 711/147, 167; 712/16
See application file for complete search history.

(56) References Cited

U.S. PATENT DOCUMENTS

| | | | |
|---|---|---|---|
| 4,251,863 A | 2/1981 | Rothenberger |
| 5,274,646 A | 12/1993 | Brey et al. |
| 5,465,235 A | 11/1995 | Miyamoto |
| 5,586,285 A | 12/1996 | Hasbun et al. |
| 5,692,165 A | 11/1997 | Jeddeleh et al. |
| 5,734,816 A | 3/1998 | Niijima et al. |
| 5,822,245 A | 10/1998 | Gupta et al. |
| 5,862,099 A | 1/1999 | Gannage et al. |
| 5,890,192 A | 3/1999 | Lee et al. |
| 5,893,135 A | 4/1999 | Hasbun et al. |
| 5,969,986 A | 10/1999 | Wong et al. |
| 6,021,463 A | 2/2000 | Belser |
| 6,029,233 A | 2/2000 | Abily et al. |
| 6,040,997 A | 3/2000 | Estakhri |
| 6,052,815 A | 4/2000 | Zook |
| 6,119,260 A | 9/2000 | Tomisawa et al. |
| 6,253,250 B1 | 6/2001 | Evans et al. |
| 6,266,273 B1 | 7/2001 | Conley et al. |

(Continued)

FOREIGN PATENT DOCUMENTS

EP    1280161 A1    1/2003

(Continued)

OTHER PUBLICATIONS

Nakamura et al., "A Novel Sense Amplifier for Flexible Voltage Operation NAND Flash Memories," 1995 *Symposium on VLSI Circuits Digest of Technical Papers*, Jun. 8-10, 1995, pp. 71-72.

(Continued)

*Primary Examiner*—Guy J Lamarre
(74) *Attorney, Agent, or Firm*—Davis Wright Tremaine LLP

(57) ABSTRACT

The present invention present methods and architectures for the pipelining of read operation with write operations. In particular, methods are presented for pipelining data relocation operations that allow for the checking and correction of data in the controller prior to its being re-written, but diminish or eliminate the additional time penalty this would normally incur. A number of architectural improvements are described to facilitate these methods, including: introducing two registers on the memory where each is independently accessible by the controller; allowing a first memory register to be written from while a second register is written to; introducing two registers on the memory where the contents of the registers can be swapped.

17 Claims, 15 Drawing Sheets

OCC-1a combined with OCC-1b

U.S. PATENT DOCUMENTS

| | | |
|---|---|---|
| 6,282,624 B1 | 8/2001 | Kimura et al. |
| 6,295,619 B1 | 9/2001 | Hasbun et al. |
| 6,317,371 B2 | 11/2001 | Katayama et al. |
| 6,330,185 B1 | 12/2001 | Wong et al. |
| 6,374,337 B1 | 4/2002 | Estakhri |
| 6,388,920 B2 | 5/2002 | Katayama et al. |
| 6,421,279 B1 | 7/2002 | Tobita et al. |
| 6,426,893 B1 | 7/2002 | Conley et al. |
| 6,449,625 B1 | 9/2002 | Wang |
| 6,456,528 B1 | 9/2002 | Chen |
| 6,490,649 B2 | 12/2002 | Sinclair |
| 6,522,586 B2 | 2/2003 | Wong |
| 6,525,952 B2 | 2/2003 | Araki et al. |
| 6,560,143 B2 | 5/2003 | Conley et al. |
| 6,581,142 B1 | 6/2003 | Jacobs |
| 6,996,003 B2 | 2/2006 | Li et al. |
| 7,120,051 B2 | 10/2006 | Gorobets et al. |
| 7,181,485 B1 | 2/2007 | Lau et al. |
| 7,266,747 B2 | 9/2007 | Foss |
| 2002/0126528 A1 | 9/2002 | Conley et al. |
| 2003/0065899 A1 | 4/2003 | Gorobets |
| 2003/0070036 A1 | 4/2003 | Gorobets |
| 2003/0099134 A1 | 5/2003 | Lasser et al. |
| 2003/0147297 A1* | 8/2003 | Shiota et al. ........... 365/230.03 |
| 2003/0163629 A1 | 8/2003 | Conley et al. |
| 2003/0169630 A1 | 9/2003 | Hosono et al. |
| 2004/0001356 A1 | 1/2004 | Kawamura et al. |
| 2004/0027857 A1 | 2/2004 | Ooishi |
| 2006/0156189 A1 | 7/2006 | Tomlin |

FOREIGN PATENT DOCUMENTS

| | | |
|---|---|---|
| EP | 0615184 | 9/2004 |
| GB | 2034942 | 6/1980 |
| JP | 5282883 | 10/1993 |
| JP | 11003290 | 11/1999 |
| WO | WO 98/44420 | 10/1998 |
| WO | WO 00/49488 | 8/2000 |
| WO | WO 00/67137 | 11/2000 |
| WO | WO 02/49039 A2 | 6/2002 |
| WO | WO 02/058074 A2 | 7/2002 |
| WO | WO 03/029951 A2 | 4/2003 |
| WO | WO 03/069627 A1 | 8/2003 |

OTHER PUBLICATIONS

Srisa-an et al., "Performance Enhancements to the Active Memory System," *2002 IEEE International Conference on Computer Design: VLSI in Computers and Processors*, Sep. 16-18, 2002, pp. 249-256.

Lee et al., "High-Performance 1-Gb NAND Flash Memory with 0.12-µm Technology," *Journal of Solid-State Circuits*, Nov. 2002, vol. 37, No. 11, pp. 1502-1509.

Imamiya et al., "A 125-mm$^2$ 1-Gb NAND Flash Memory with 10/Mbyte/s Program Speed," *IEEE Journal of Solid State Circuits*, vol. 37, No. 11, Nov. 2002, pp. 1493-1501.

Notification of Transmittal of the International Search Report and the Written Opinion of the International Searching Authority, or the Declaration for International Application No. PCT/US2005/043020 mailed May 10, 2006, 9 pages.

Listing of Pending Claims for International Application No. PCT/US2005/043020, 7 pages.

Toshiba MOS Digital Integrated Circuit Silicon Gate CMOS Data Sheet, TC58NDG1SBFT10, *Toshiba*, Dec. 5, 2002, pp. 1/46, 35/46-37/46.

Notification of Transmittal of the International Search Report and the Written Opinion of the International Searching Authority, or the Declaration for International Application No. PCT/US2005/016341 mailed Oct. 19, 2005, 12 pages.

Office Action for U.S. Appl. No. 11/022,350 mailed Sep. 27, 2007, 35 pages.

European Office Action for Application No. 05 852 349.9, mailed May 7, 2008, 4 pages.

* cited by examiner

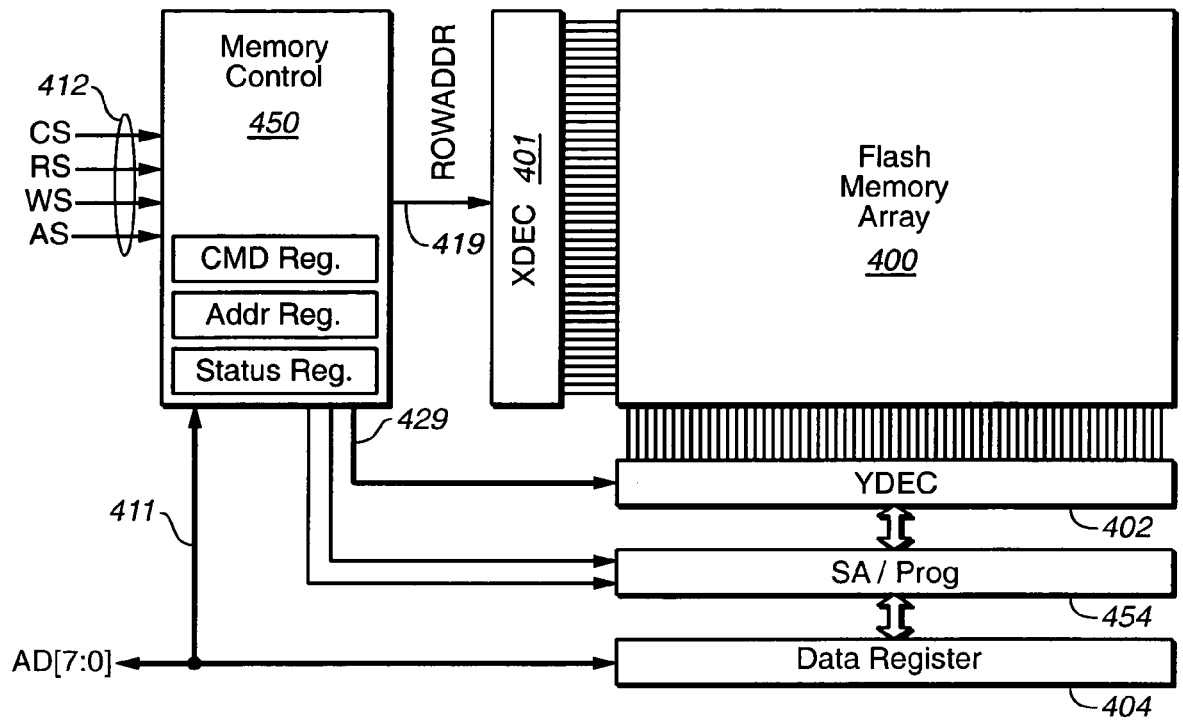
FIG._1
*(PRIOR ART)*
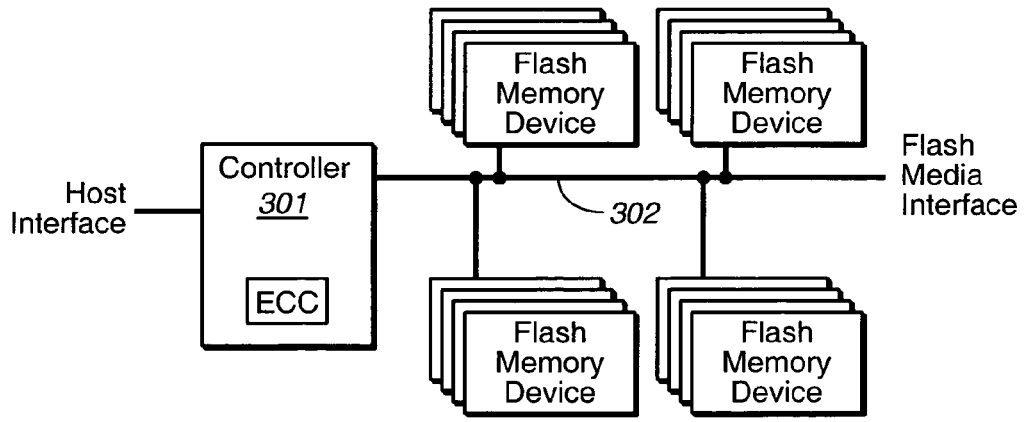
FIG._2
*(PRIOR ART)*

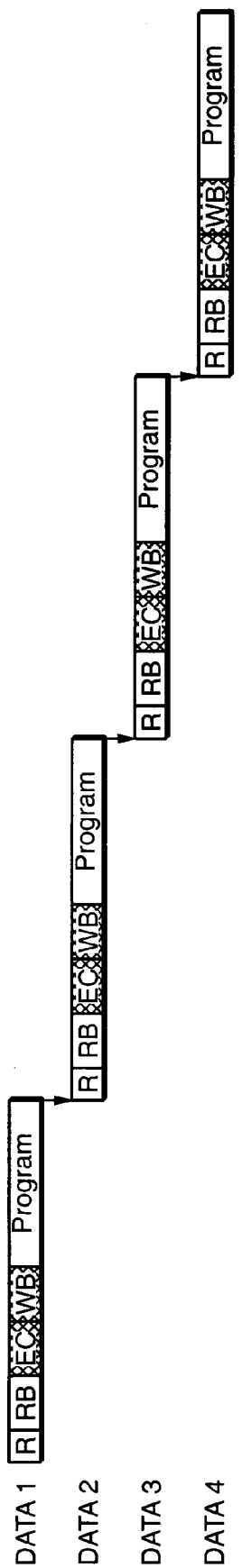
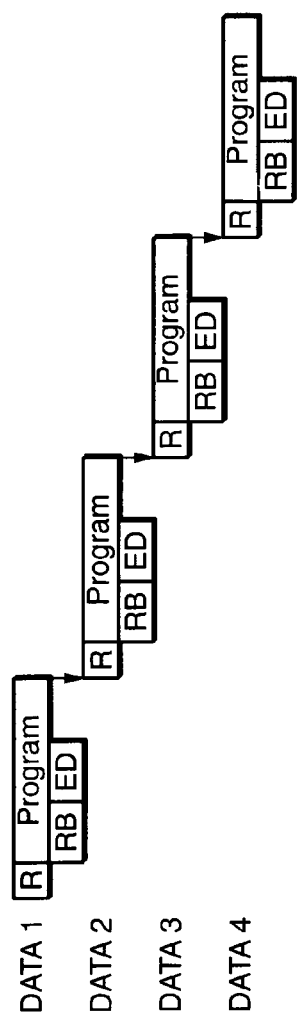

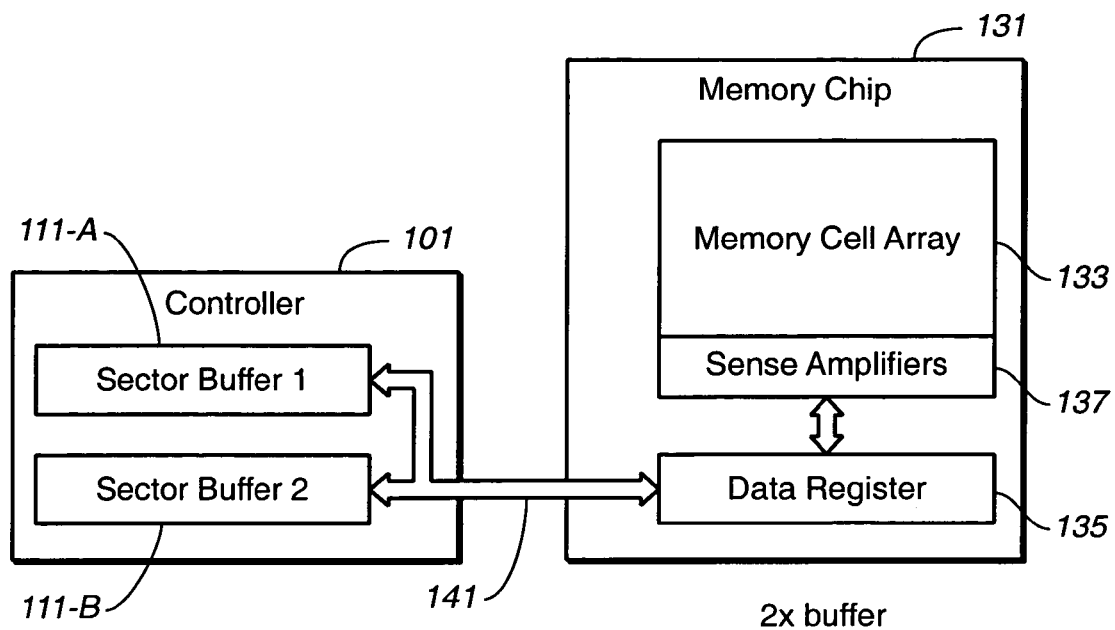
FIG._5
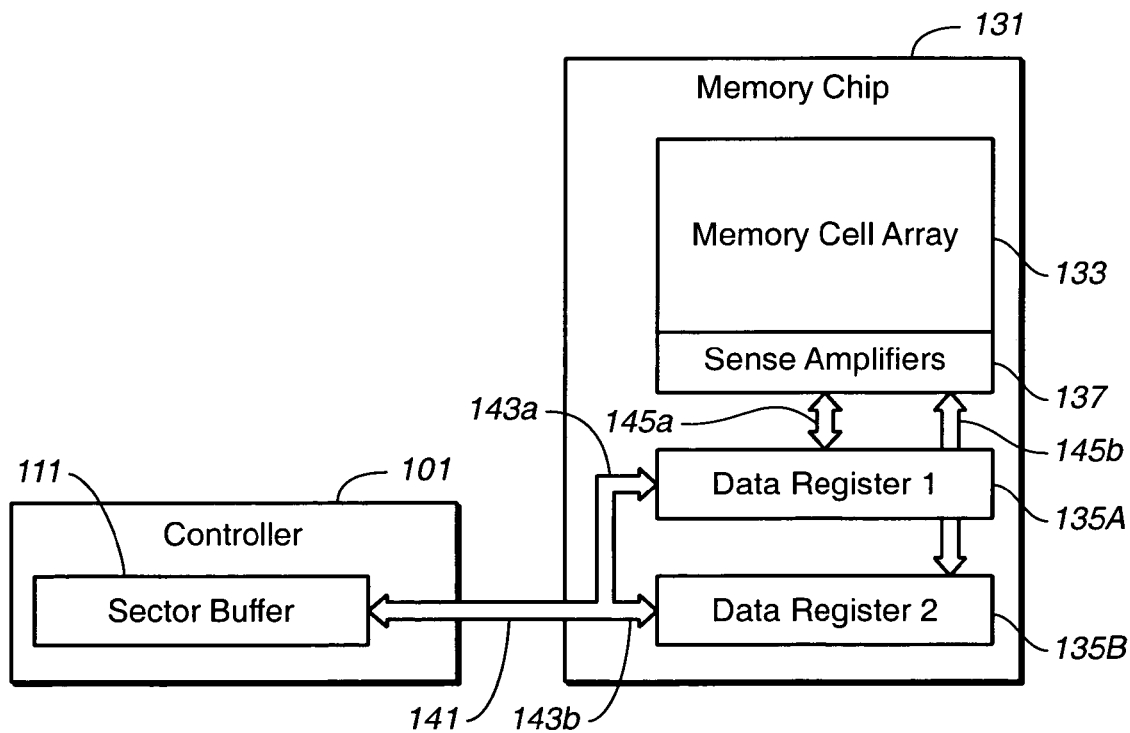
FIG._6

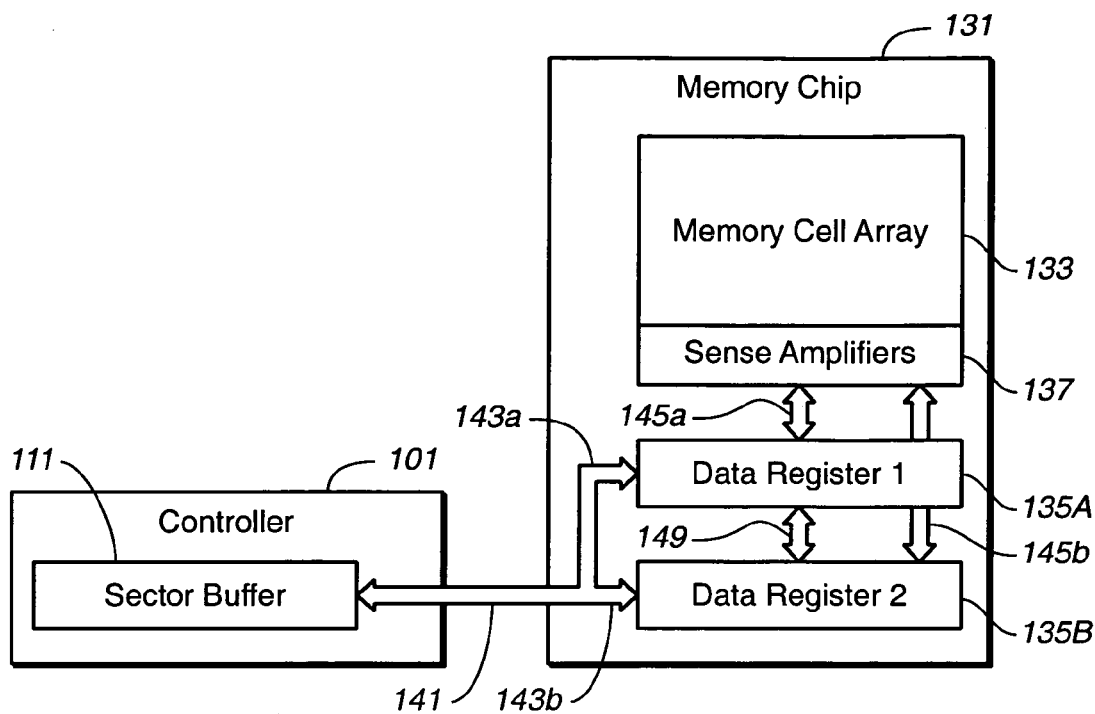
OCC-1a combined with OCC-1b
FIG._7
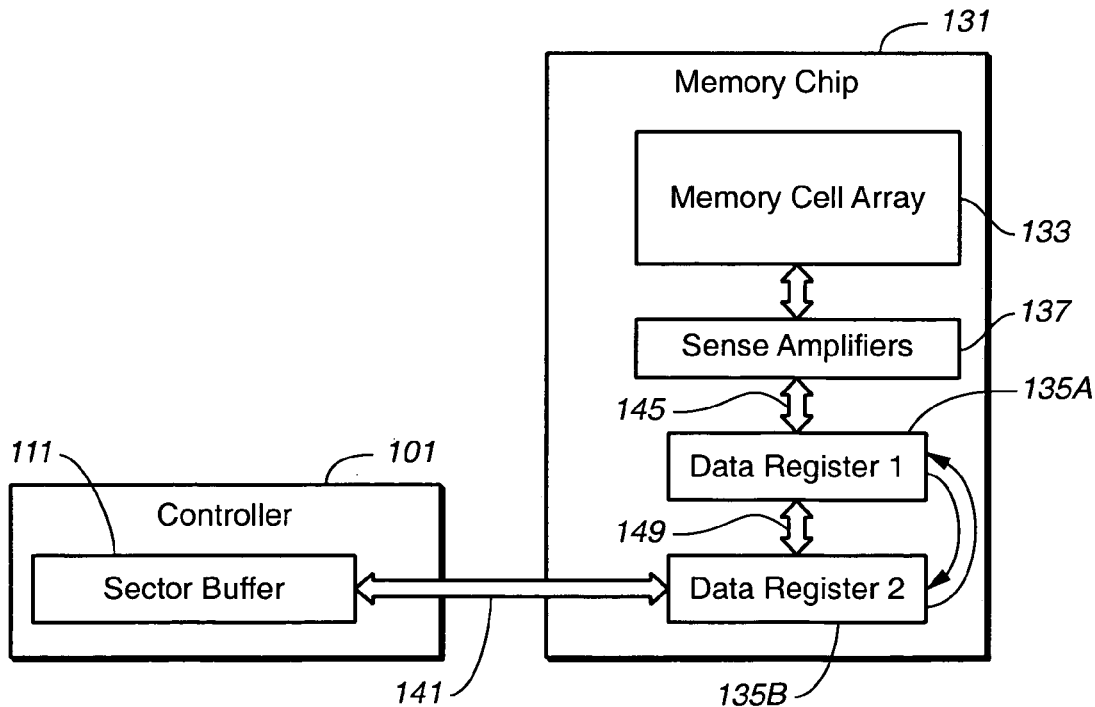
FIG._8

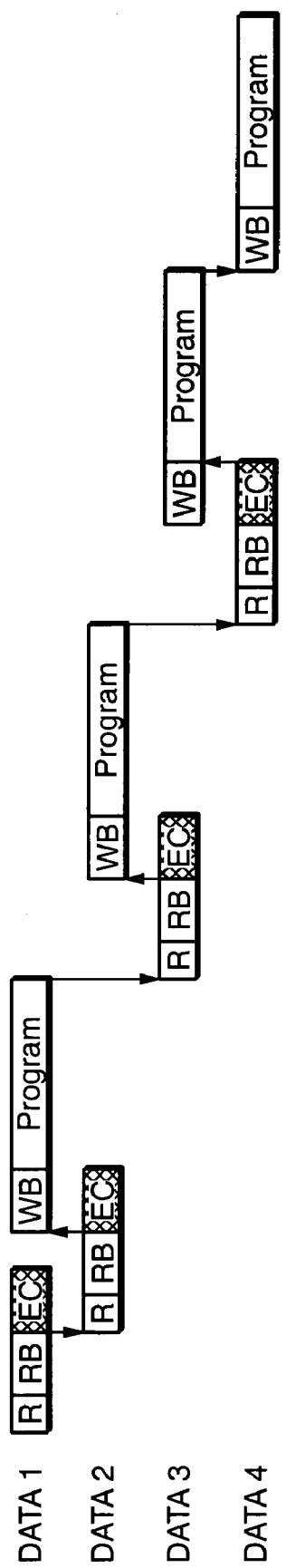
FIG._9
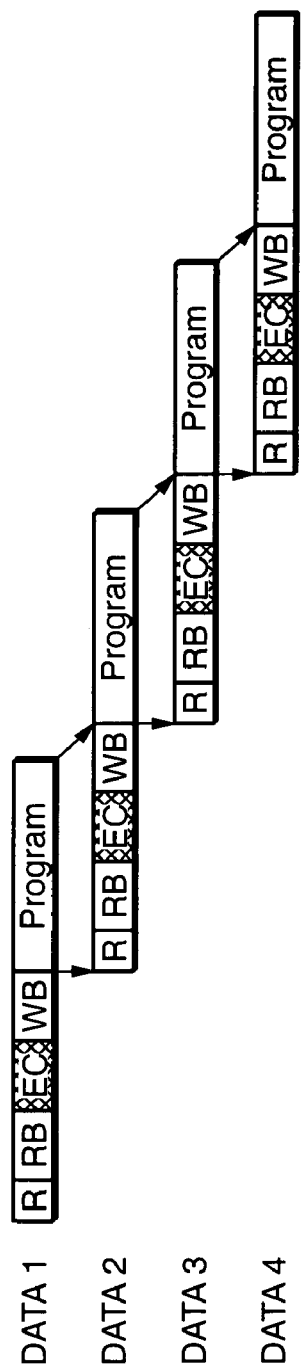
FIG._10

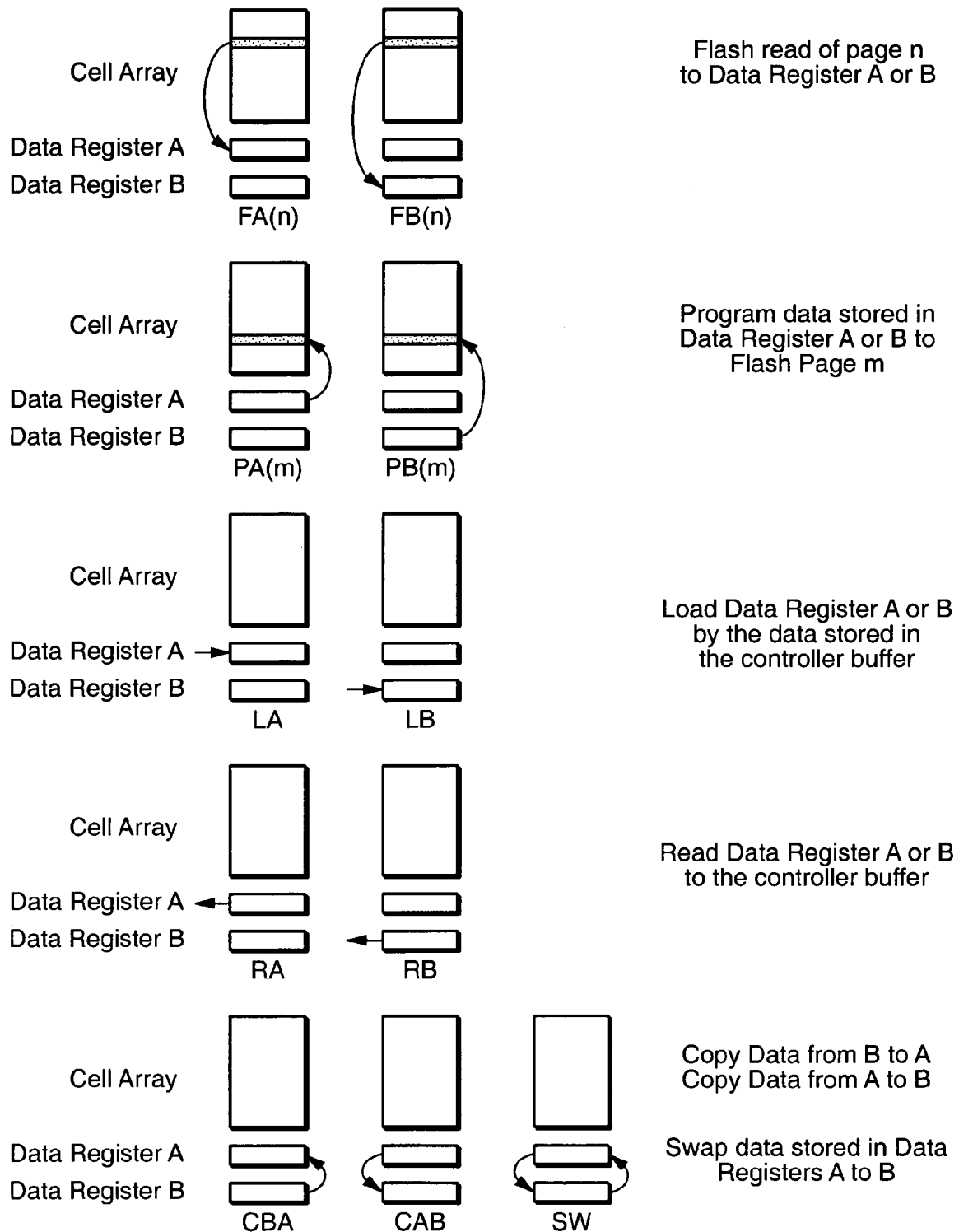
FIG._11

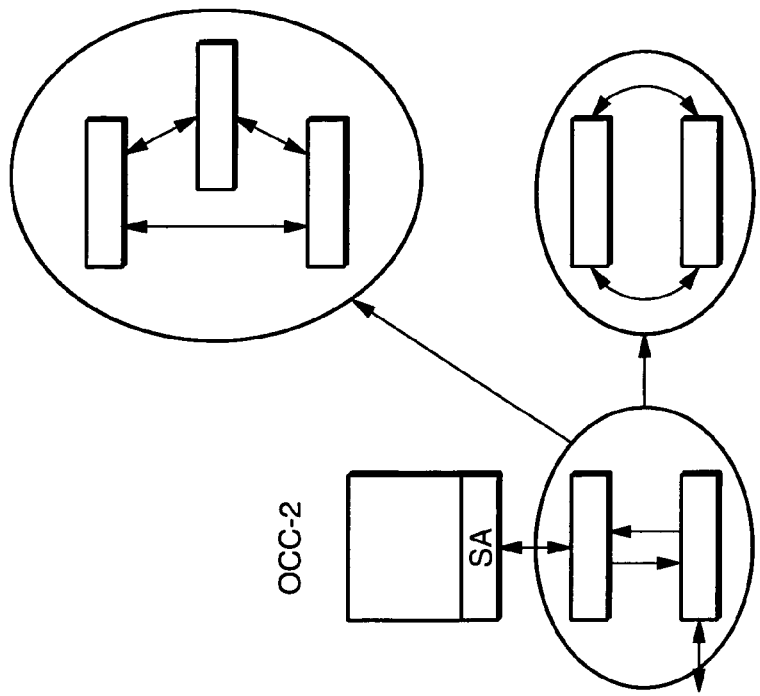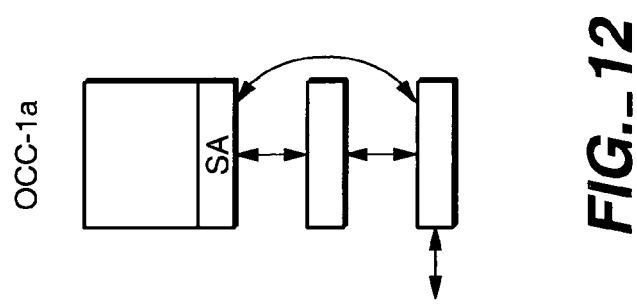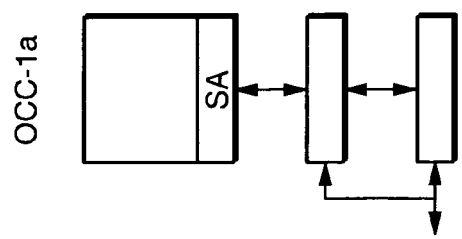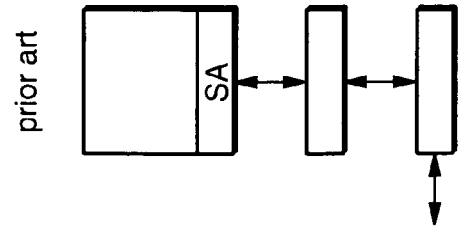
FIG._12

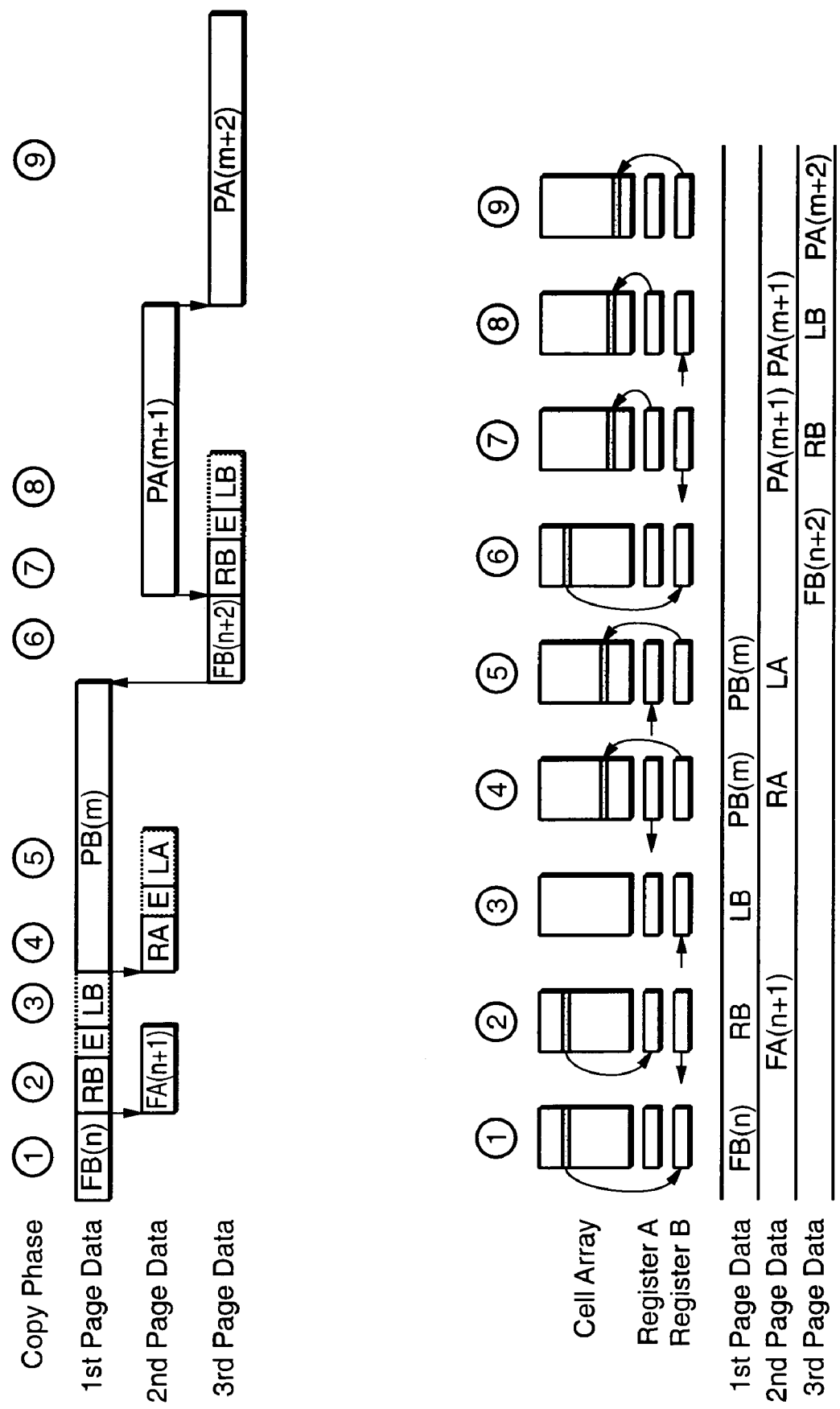
FIG._13

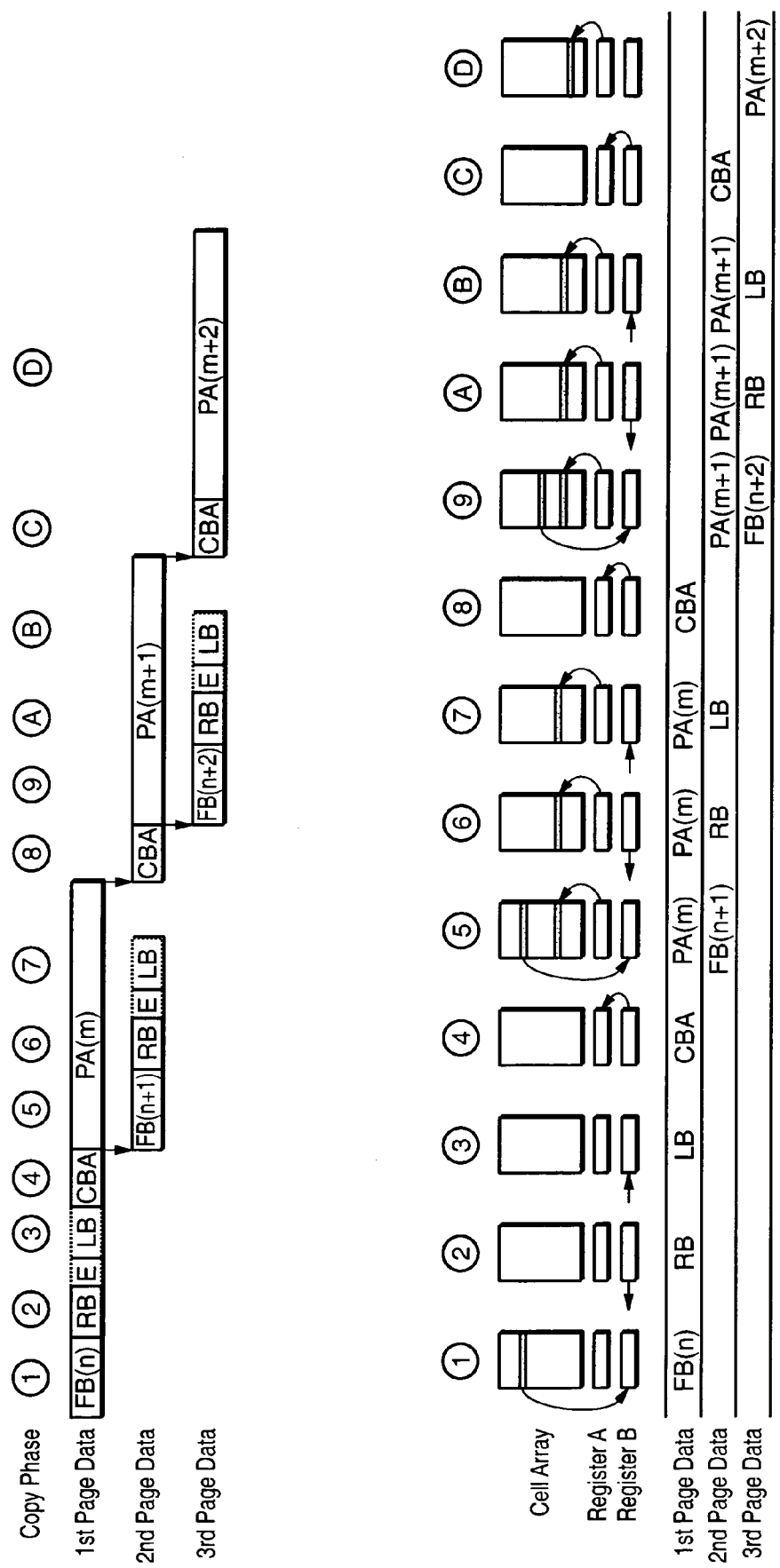
FIG._14

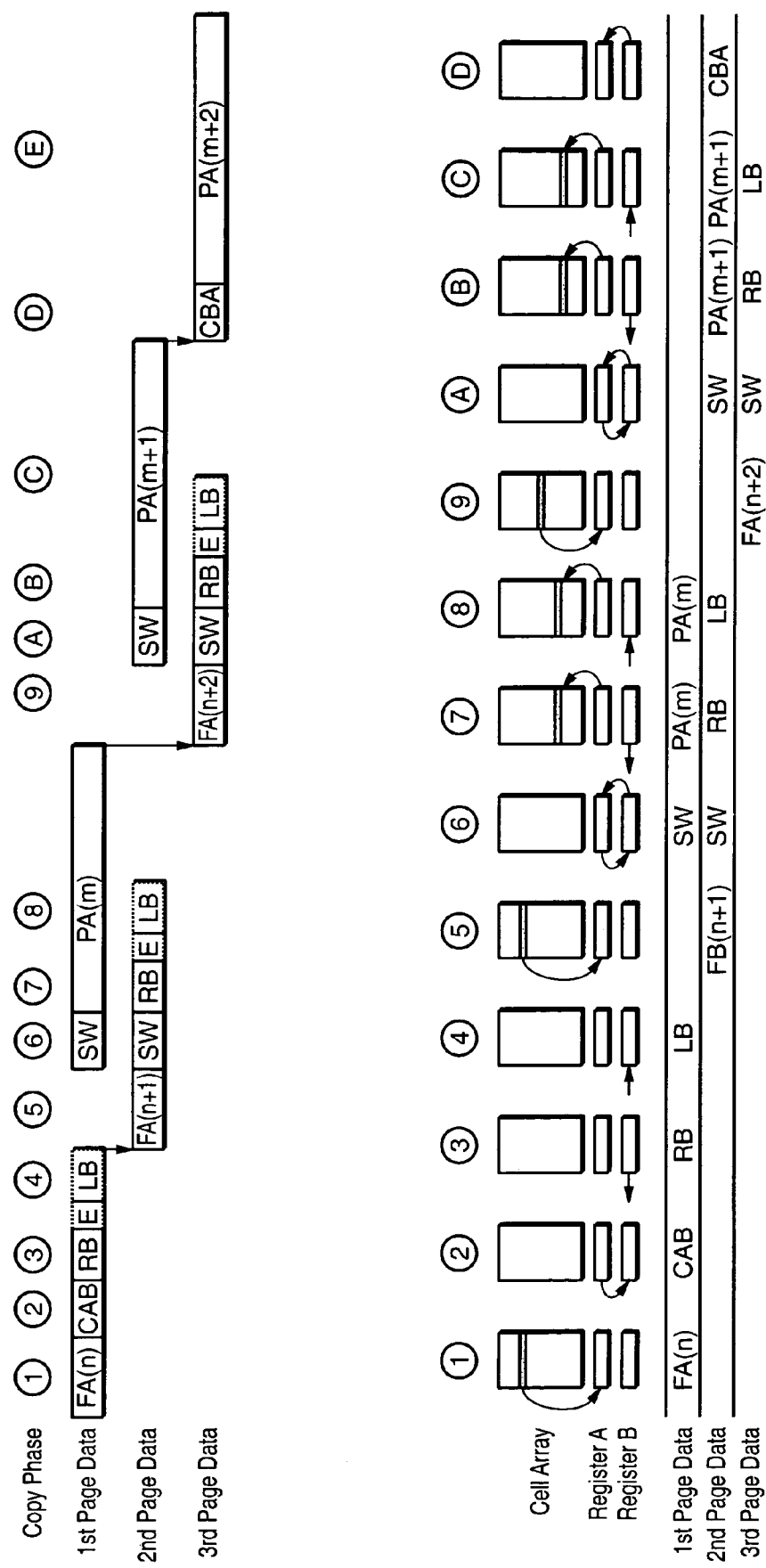
FIG._15

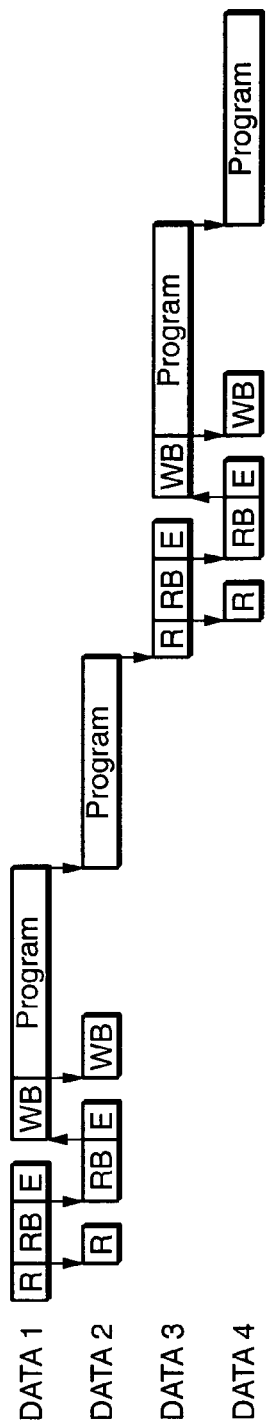
FIG._16
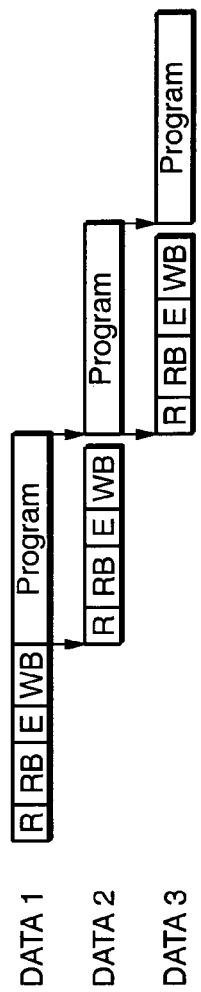
FIG._19
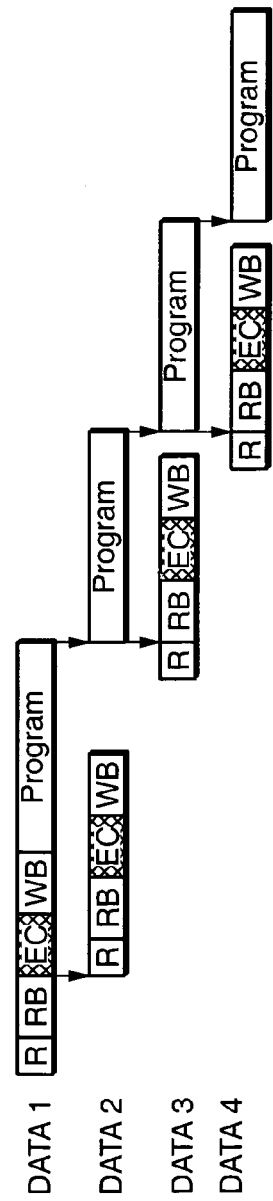
FIG._22

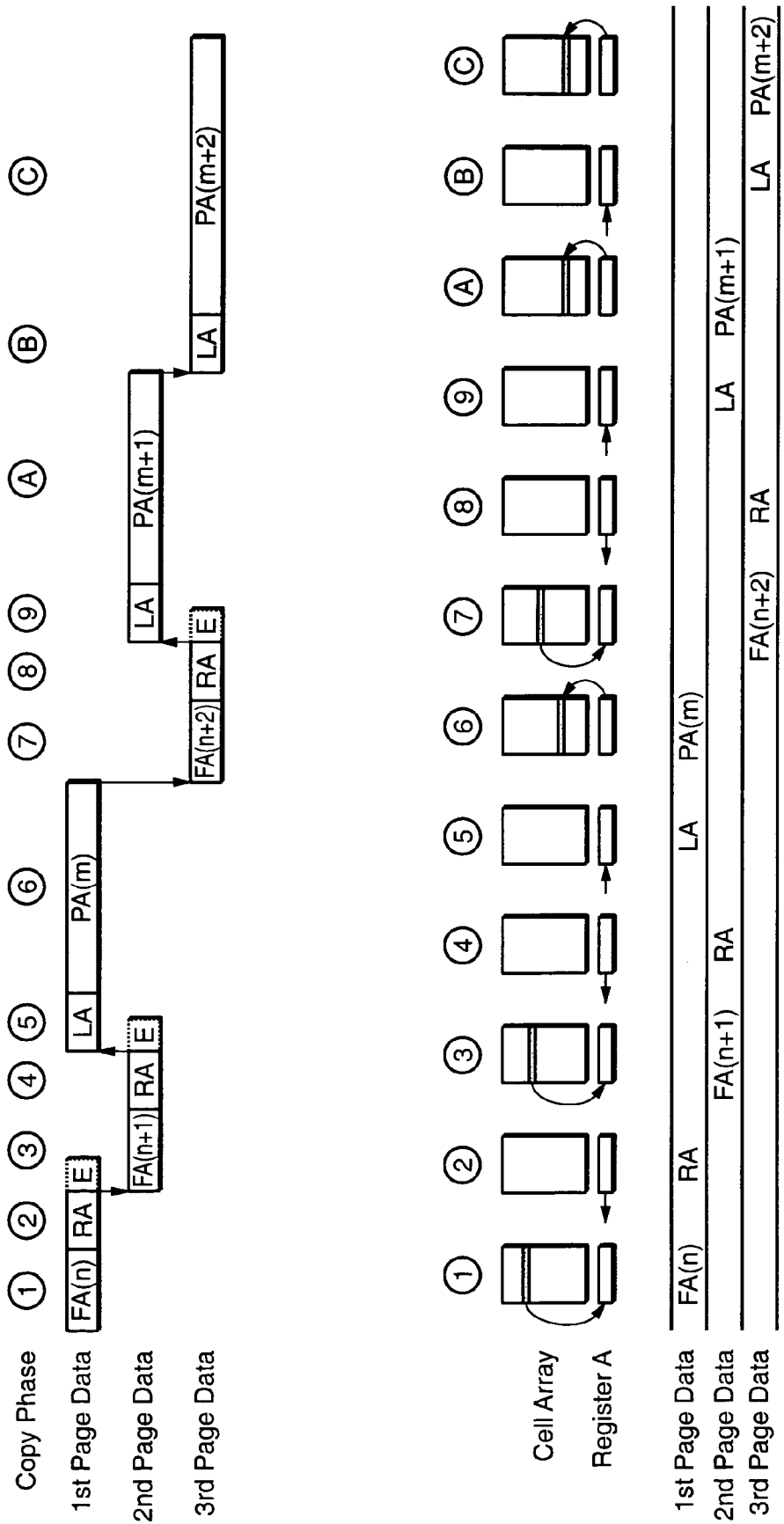
FIG._17

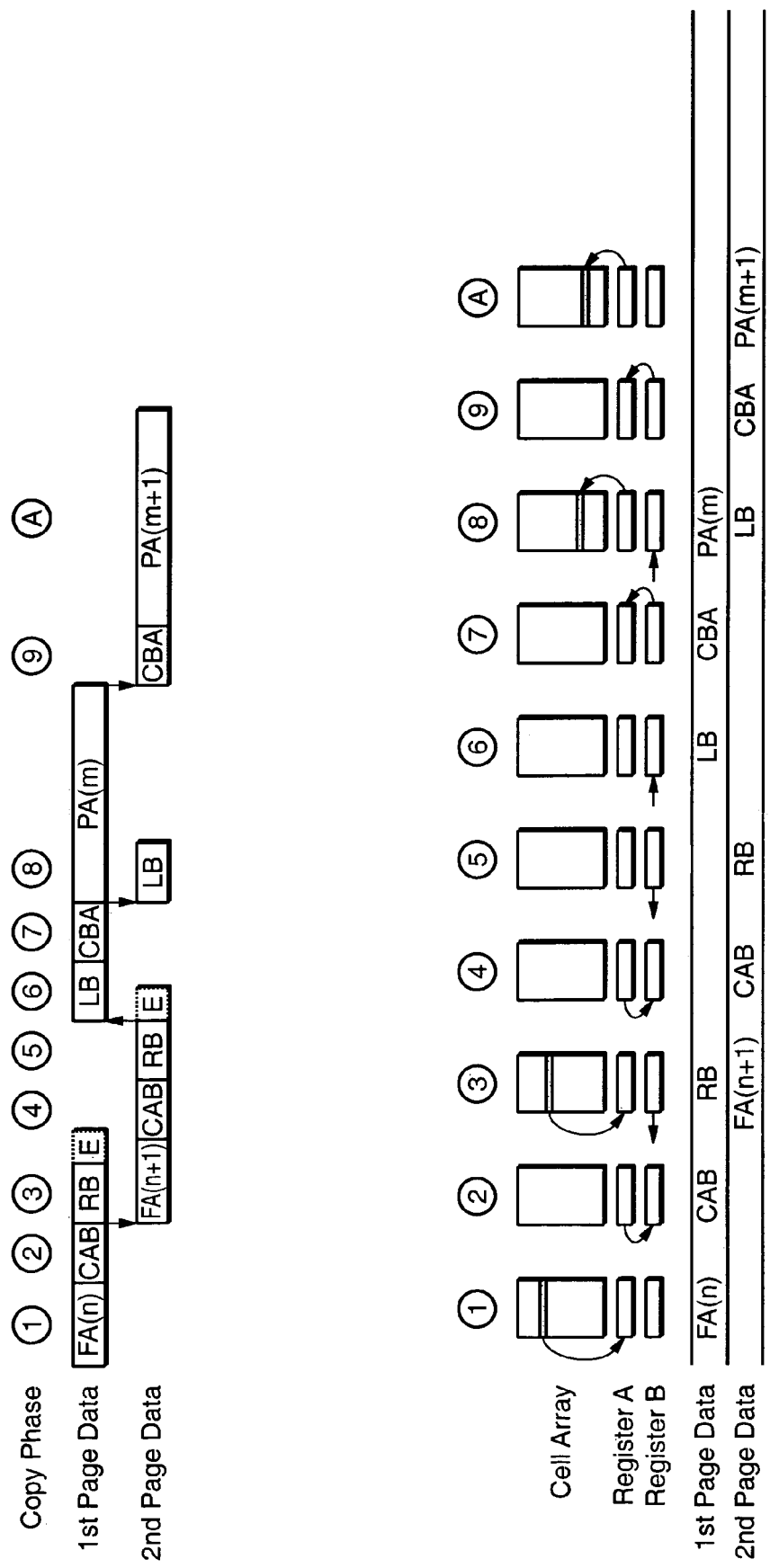
FIG._18

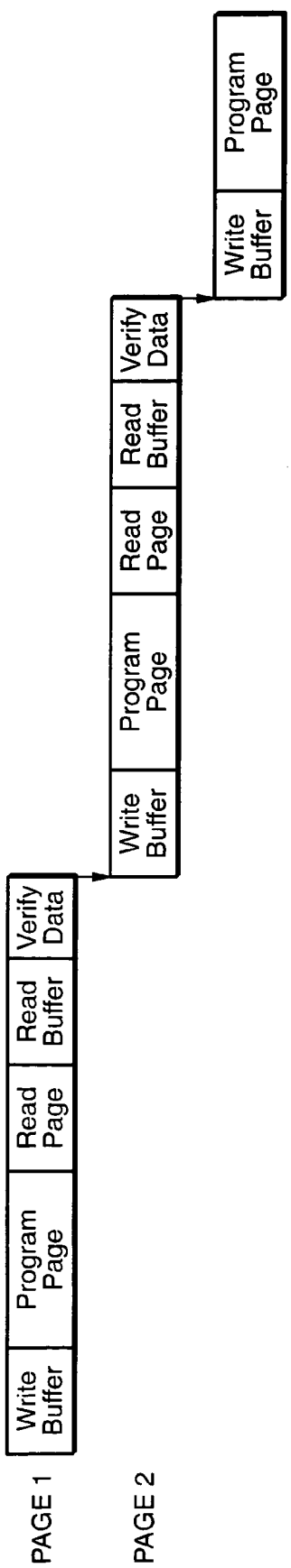
FIG._20
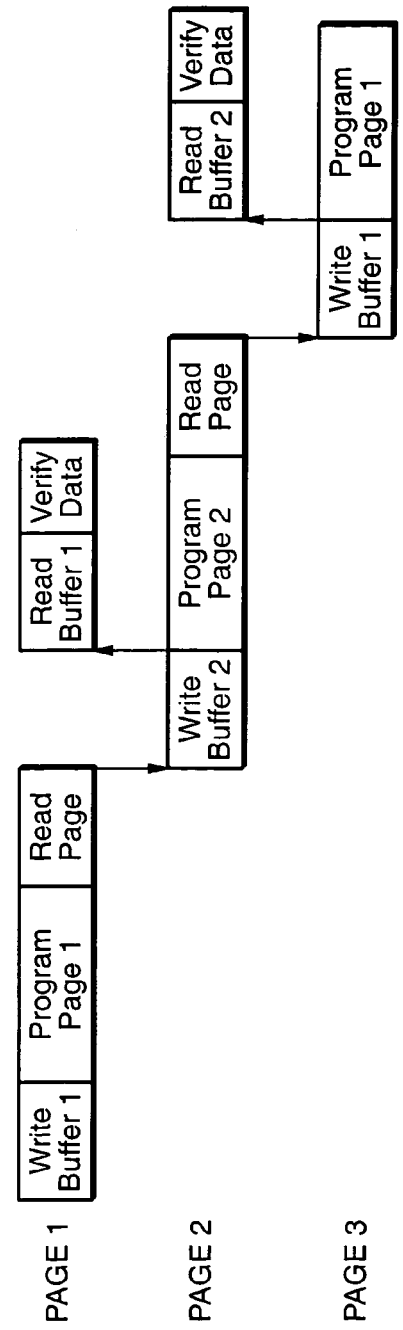
FIG._21

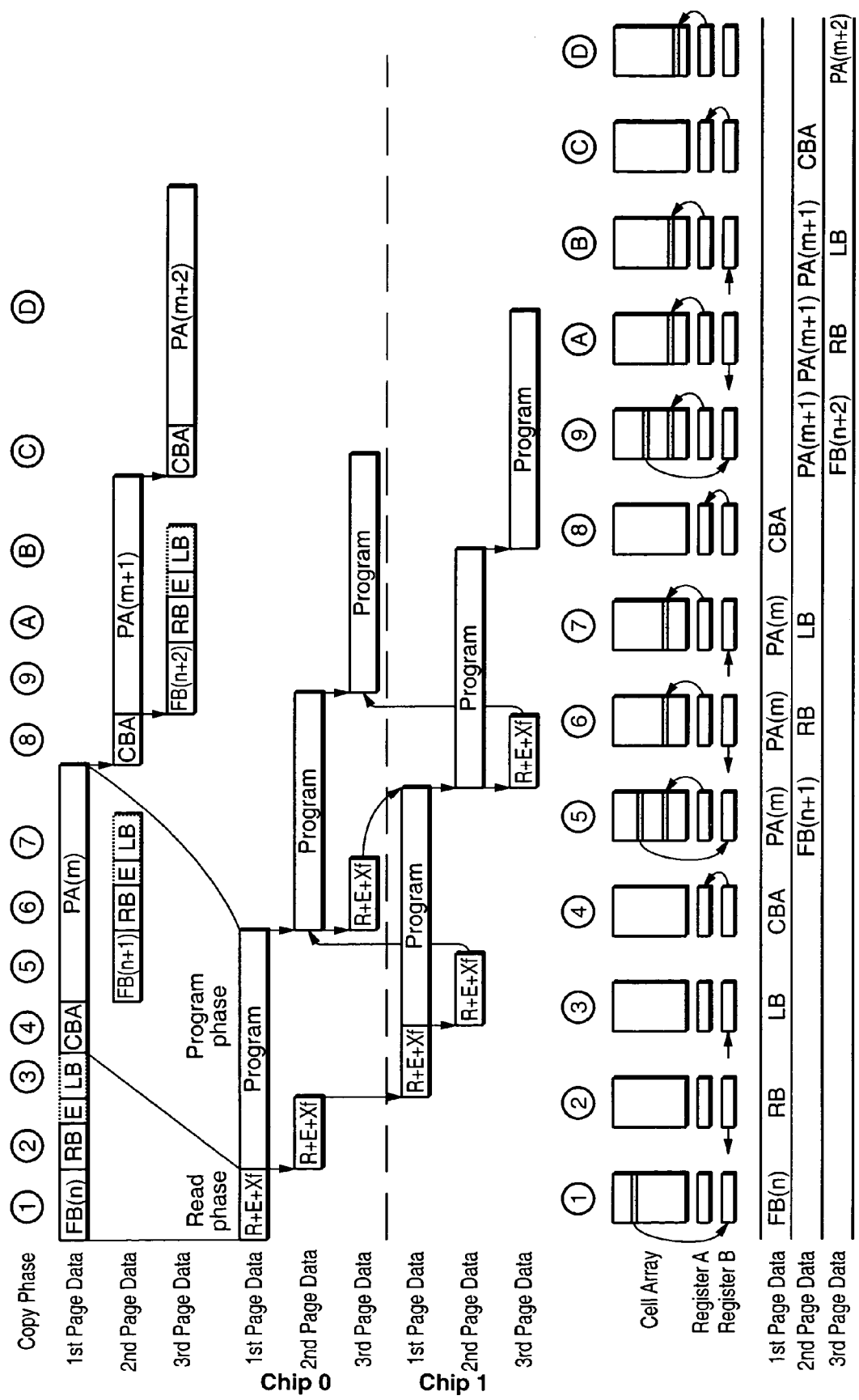
FIG._23

PIPELINED DATA RELOCATION AND IMPROVED CHIP ARCHITECTURES

BACKGROUND OF THE INVENTION

This invention pertains to the field of semiconductor nonvolatile data storage system architectures and their methods of operation, and has application to data storage systems based on flash electrically erasable and programmable read-only memories (EEPROMs) and other types of memory system.

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data; although the size of a write page need not be the same as the size of a read page, in the following they are treated as being the same in order to simplify the discussion. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses (LBAs) received by the memory sub-system from a host, and physical block numbers (PBNs) and page addresses within the memory cell array. This translation often involves use of intermediate terms for a logical block number (LBN) and logical page. The controller also manages the low level flash circuit operation through a series of commands that it issues to the flash memory devices via an interface bus. Another function the controller performs is to maintain the integrity of data stored to the subsystem through various means, such as by using an error correction code (ECC).

FIG. 1 shows a typical internal architecture for a flash memory device 131. The primary features include an input/output (I/O) bus 411 and control signals 412 to interface to an external controller, a memory control circuit 450 to control internal memory operations with registers for command, address and status signals. One or more arrays 400 of flash EEPROM cells are included, each array having its own row decoder (XDEC) 401 and column decoder (YDEC) 402, a group of sense amplifiers and program control circuitry (SA/PROG) 454 and a data register 404. Presently, the memory cells usually include one or more conductive floating gates as storage elements but other long term electron charge storage elements may be used instead. The memory cell array may be operated with two levels of charge defined for each storage element to therefore store one bit of data with each element. Alternatively, more than two storage states may be defined for each storage element, in which case more than one bit of data is stored in each element.

If desired, a plurality of arrays 400, together with related X decoders, Y decoders, program/verified circuitry, data registers, and the like are provided, for example as taught by U.S. Pat. No. 5,890,192, issued Mar. 30, 1999, and assigned to SanDisk Corporation, the assignee of this application, which is hereby incorporated by this reference. Related memory system features are described in co-pending patent application Ser. No. 09/505,555, filed Feb. 17, 2000 by Kevin Conley et al., which application is expressly incorporated herein by this reference.

The external interface I/O bus 411 and control signals 412 can include the following:

CS—Chip Select. Used to activate flash memory interface.
RS—Read Strobe. Used to indicate the I/O bus is being used to transfer data from the memory array.
WS—Write Strobe. Used to indicate the I/O bus is being used to transfer data to the memory array.
AS—Address Strobe. Indicates that the I/O bus is being used to transfer address information.
AD[7:0]—Address/Data Bus This I/O bus is used to transfer data between controller and the flash memory command, address and data registers of the memory control 450.

In addition to these signals, it is also typical that the memory have a means by which the storage subsystem controller may determine that the memory is busy performing some task. Such means could include a dedicated signal or a status bit in an internal memory register that is accessible while the memory is busy.

This interface is given only as an example as other signal configurations can be used to give the same functionality. FIG. 1 shows only one flash memory array 400 with its related components, but a multiplicity of such arrays can exist on a single flash memory chip that share a common interface and memory control circuitry but have separate XDEC 401, YDEC 402, SA/PROG 454 and DATA REG 404 circuitry in order to allow parallel read and program operations. More generally, there may be one or two additional such data registers typically arranged into the sort of master slave arrangements developed further in U.S. Pat. No. 6,560,143, which is hereby incorporated by reference. Another arrangement for a flash memory architecture using multiple data buffers is described in U.S. Pat. No. 5,822,245.

Data is transferred from the memory array through the data register 404 to an external controller via the data registers' coupling to the I/O bus AD[7:0] 411. The data register 404 is also coupled with/to the sense amplifier/programming circuit 454. The data registers 404 can similarly be connected/coupled to the same sense amplifier/programming circuit 454. The number of elements of the data register coupled to each sense amplifier/programming circuit element may depend on the number of bits stored in each storage element of the memory cells, flash EEPROM cells each containing one or more floating gates as the storage elements. Each storage element may store a plurality of bits, such as 2 or 4, if the memory cells are operated in a multi-state mode. Alternatively, the memory cells may be operated in a binary mode to store one bit of data per storage element.

The row decoder 401 decodes row addresses for the array 400 in order to select the physical page to be accessed. The row decoder 401 receives row addresses via internal row address lines 419 from the memory control logic 450. A column decoder 402 receives column addresses via internal column address lines 429 from the memory control logic 450.

FIG. 2 shows an architecture of a typical non-volatile data storage system, in this case employing flash memory cells as the storage media. In one form, this system is encapsulated within a removable card having an electrical connector extending along one side to provide the host interface when inserted into a receptacle of a host. Alternatively, the system of FIG. 2 may be embedded into a host system in the form of a permanently installed embedded circuit or otherwise. The system utilizes a single controller 101 that performs high-level host and memory control functions. The flash memory media is composed of one or more flash memory devices, each such device often formed on its own integrated circuit chip. The system controller and the flash memory are connected by a bus 121 that allows the controller 101 to load command, address, and transfer data to and from the flash memory array. (The bus 121 includes 412 and 411 of FIG. 1.) The controller 101 interfaces with a host system (not shown) with which user data is transferred to and from the flash memory array. In the case where the system of FIG. 2 is included in a card, the host interface includes a mating plug and socket assembly (not shown) on the card and host equipment. Alternatively, there are removable cards, such as in the xD, SmartMedia, or MemoryStick formats, that lack a controller and contain only Flash Memory devices, so that the host system includes the controller 301, which interfaces the card via Flash Media Interface 302.

The controller 101 receives a command from the host to read or write one or more sectors of user data starting at a particular logical address. This address may or may not align with the first physical page in a block of memory cells.

In some prior art systems having large capacity memory cell blocks that are divided into multiple pages, the data from a block that is not being updated needs to be copied from the original block to a new block that also contains the new, updated data being written by the host. In other prior art systems, flags are recorded with the user data in pages and are used to indicate that pages of data in the original block that are being superceded by the newly written data are invalid. A mechanism by which data that partially supercedes data stored in an existing block can be written without either copying unchanged data from the existing block or programming flags to pages that have been previously programmed is described in co-pending patent application "Partial Block Data Programming and Reading Operations in a Non-Volatile Memory", Ser. No. 09/766,436, filed Jan. 19, 2001 by Kevin Conley, which application is expressly incorporated herein by this reference.

Non-volatile memory systems of this type are being applied to a number of applications, particularly when packaged in an enclosed card that is removable connected with a host system. Current commercial memory card formats include that of the Personal Computer Memory Card International Association (PCMCIA), CompactFlash (CF), MultiMediaCard (MMC), MemoryStick-Pro, xD-Picture Card, SmartMedia and Secure Digital (SD). One supplier of these cards is SanDisk Corporation, assignee of this application. Host systems with which such cards are used include personal computers, notebook computers, hand held computing devices, cameras, audio reproducing devices, and the like. Flash EEPROM systems are also utilized as bulk mass storage embedded in host systems.

Such non-volatile memory systems include one or more arrays of floating-gate memory cells and a system controller. The controller manages communication with the host system and operation of the memory cell array to store and retrieve user data. The memory cells are grouped together into blocks of cells, a block of cells being the smallest grouping of cells that are simultaneously erasable. Prior to writing data into one or more blocks of cells, those blocks of cells are erased. User data are typically transferred between the host and memory array in sectors. A sector of user data can be any amount that is convenient to handle, preferably less than the capacity of the memory block, often being equal to the standard disk drive sector size, 512 bytes. In one commercial architecture, the memory system block is sized to store one sector of user data plus overhead data, the overhead data including information such as an error correction code (ECC) for the user data stored in the block, a history of use of the block, defects and other physical information of the memory cell block. Various implementations of this type of non-volatile memory system are described in the following United States patents and pending applications assigned to SanDisk Corporation, each of which is incorporated herein in its entirety by this reference: U.S. Pat. Nos. 5,172,338, 5,602,987, 5,315,541, 5,200,959, 5,270,979, 5,428,621, 5,663,901, 5,532,962, 5,430,859 and 5,712,180, and application Ser. No. 08/910,947, filed Aug. 7, 1997, and Ser. No. 09/343,328, filed Jun. 30, 1999. Another type of non-volatile memory system utilizes a larger memory cell block size that stores multiple sectors of user data.

One architecture of the memory cell array conveniently forms a block from one or two rows of memory cells that are within a sub-array or other unit of cells and which share a common erase gate. U.S. Pat. Nos. 5,677,872 and 5,712,179 of SanDisk Corporation, which are incorporated herein in their entirety, give examples of this architecture. Although it is currently most common to store one bit of data in each floating gate cell by defining only two programmed threshold levels, the trend is to store more than one bit of data in each cell by establishing more than two floating-gate transistor threshold ranges. A memory system that stores two bits of data per floating gate (four threshold level ranges or states) is currently available, with three bits per cell (eight threshold level ranges or states) and four bits per cell (sixteen threshold level ranges) being contemplated for future systems. Of course, the number of memory cells required to store a sector of data goes down as the number of bits stored in each cell goes up. This trend, combined with a scaling of the array resulting from improvements in cell structure and general semiconductor processing, makes it practical to form a memory cell block in a segmented portion of a row of cells. The block structure can also be formed to enable selection of operation of each of the memory cells in two states (one data bit per cell) or in some multiple such as four states (two data bits per cell), as described in SanDisk Corporation U.S. Pat. No. 5,930,167, which is incorporated herein in its entirety by this reference.

In addition to increasing the capacity of such non-volatile memories, there is a search to also improve such memories by increasing their performance and decreasing their susceptibility to error. Memories such as those described above that utilize large block management techniques perform a number of data management of techniques on the memory's file system, including garbage collection, in order to use the memory area more effectively. Such garbage collection schemes involve a data relocation process including reading data from one (or more) locations in the memory and re-writing it into another memory location. (In addition to many of the above incorporated references, garbage collection is discussed further in, for example, "A 125-mm² 1-Gb NAND Flash Memory With 10-MByte/s Program Speed", by K. Imamiya, et al., IEEE Journal of Solid-State Circuits, Vol. 37, No. 11, November 2002, pp. 1493-1501, which is hereby incorporated in its entirety by this reference.) This data relocation time is a main contributor to all garbage collection routines. Prior art methods describe the data relocation operation as a consecutive data read, then data integrity check and error correction, if necessary, before writing the data to a new location, so that there is a high constant performance penalty of data transfer and verification. In the case of data error, additional time must be spent to correct the data before write.

Other prior art methods exploit an on-chip copy feature, writing the data from one location to another without a pre-check of the data integrity. Such a method is described, for example, in "High Performance 1-Gb NAND Flash Memory With 0.12 µm Technology", by J. Lee, et al., IEEE Journal of Solid-State Circuits, Vol. 37, No. 11, November 2002, pp. 1502-1509, which is hereby incorporated in its entirety by this reference. The integrity check is done concurrently with the data write so that, in the case of error, there is a high probability of the need to rewrite the entire block with a high penalty in performance and time-out/latency.

An example of a simple copy sequence in the prior art, where the data is checked/corrected before being reprogrammed, is shown in FIG. 3. This shows a first set of data (DATA 1) sequentially being read from memory 400 into data register 404 (R), then the read of the buffer by the controller (RB), the data being checked and any errors corrected (EC) in the controller, the writing the checked/corrected data from the buffer (WB) back to the register 404, from where it is programmed (Program) back into the memory array 400. After the entire process is complete for DATA 1, the same steps are sequentially repeated for the next data set DATA 2, followed by DATA 3 and so on. For each set of data, the entire process is completed before it begins for the subsequent data set so that the all of the error correction times accumulate.

An example of the timing for data relocation where the data is read from the memory array 400 into the register 404, and then read to the buffer in the controller and concurrently programmed directly back into the memory is described in U.S. Pat. No. 6,266,273, which is hereby incorporated by reference. This simple copy sequence, but now with the data checked after the start of programming, is shown in FIG. 4. As shown there, after reading the data set to the register (R), it is then both read into the controller's buffer (RB) and written back to the memory array (Program). Once the data set is buffered in the controller, it can then be checked/corrected for error (E); however, even though there will now be a corrected set of data in the controller that can be supplied to the host, if there are errors to correct, these errors are written back to the memory as programming has begun before the data set has been checked and corrected. As with the process of FIG. 3, the entire process of FIG. 4 has to be completed each set of data before it can begin for the subsequent data set.

Prior art system flash/EEPROM architectures do not allow independent access to the data in one on-chip buffer to while another buffer is used for concurrent read or program operation. Thus, operations that include mixture of reads and writes, like garbage collection, cannot be pipelined in prior art systems.

SUMMARY OF THE INVENTION

According to one principal aspect of the present invention, briefly and generally, a data relocation method is presented which allows the correction of data errors during garbage collection operations without any penalty to overall performance and time-out/latency in defect tolerant systems, thereby allowing the usage of flash memory with higher error rate in performance critical applications. In a more general aspect of the present invention, improved memory architectures allows data transfers between controller and the memory concurrently with read and program operations, thus accelerating complex data operations such as data relocation, or garbage collection, and write-read back-verify processes, particularly for systems with high error rate memories.

The invention describes a method of pipelined relocation of multiple data portions, where an integrity check and error correction of a current data portion is done concurrently with the programming of the previous data portion. When multiple pages (or data portions) are being relocated from one memory location to another (inside a chip or from one chip to another) the system always reads one data page in advance. After the advance page read, the system starts programming the previously read page. While the previously read page is being programmed, the system checks the data integrity of the advance read page and corrects the error if necessary and transfers it back to the flash memory register. Additionally, the system can also use the "wait" during the transfer of one data set for correction of the other data set. Thus, as the data check and correction happens simultaneously with the previous page programming there is no time penalty in the case of system with high error rate unless the error correction takes longer than a page programming operation. In this way, the data relocation pipelining hides error correction operations and the systems no longer has additional performance penalty when there is a read error. The system then can use a memory with much higher error rate without compromising the performance.

In a particular embodiment, a flash/EEPROM memory chip has two independent data registers, where each register can be used for data access by the controller while the other is used for program or read operations of data to or from the memory cell array. Every register has a capacity of up to one memory page and can be used by individual data transfer commands Read Register and Write. The above data transfer commands can be executed simultaneously with the flash memory being programmed or read. The read and program commands are also specific for each register. This architecture also provides mechanism for internal, on-chip, pipelining of other complex data operations such as Write-Read Back-Verify.

In another embodiment, a flash/EEPROM memory chip has two data registers, where one register can read out data from the memory array while the other is used for programming operations of data to the memory cell array. Every register has a capacity of up to one memory page and can be used by individual data transfer commands Read Register and Write. This architecture also provides mechanism for internal, on-chip, pipelining of other complex data operations such as Write-Read Back-Verify.

In another alternate embodiment, the memory again has two data registers, but only one can be directly accessed by the controller, while only the other can directly exchange data with the memory array. By incorporating a swap operation where the contents of the two registers can be exchanged, the alternated embodiment can function in a manner largely equivalent the embodiment with two independent registers. The features of the various architectures can be combines for further improvements in performance.

Additional aspects, features and advantages of the present invention are included in the following description of exemplary embodiments, which description should be read in conjunction with the accompanying drawings.

BRIEF DESCRIPTION OF THE DRAWINGS

FIG. 1 is a block diagram of a typical prior art flash EEPROM memory array with memory control logic, data and address registers.

FIG. 2 illustrates an architecture utilizing memories of FIG. 1 with a system controller.

FIG. 3 shows an example of a simple copy sequence in the prior art.

FIG. 4 shows an example of a copy sequence in the prior art where each data set is checked after the start of programming.

FIG. 5 illustrates a first memory architecture in which the present invention can be implemented.

FIG. 6 illustrates a second memory architecture in which the present invention can be implemented.

FIG. 7 shows features of the embodiment of FIG. 6.

FIG. 8 illustrates another memory architecture in which the present invention can be implemented.

FIGS. 9 and 10 illustrate the general concept of pipelining data relocation operations.

FIG. 11 explains some of the notation used in FIGS. 13-15, 17, and 18.

FIG. 12 summarizes the operations specific to the different memory architectures.

FIGS. 13-15 illustrate several basic on chip copy functions using aspects of the present invention.

FIG. 16 shows an embodiment of the present invention based upon the architecture of FIG. 5.

FIGS. 17 and 18 isolate aspects of the present invention that may used in an embodiment based on the architecture of FIG. 5.

FIG. 19 shows an embodiment combining aspects of FIGS. 13 and 14.

FIG. 20 shows a prior art Write-Read back-Verify operation.

FIG. 21 shows a Write-Read back-Verify operation according to the present invention.

FIG. 22 shows a pipelined chip-to-chip copy process.

FIG. 23 shows the pipelining of on-chip copy processes from multiple chips, where the copy process on each chip is itself pipelined.

DESCRIPTION OF EXEMPLARY
EMBODIMENTS OF THE INVENTION

In a first aspect, the present invention describes a data relocation method that allows correction of data errors during garbage collection operations without any penalty to overall performance and time-out/latency in defect tolerant systems, and thus, allows usage of flash memory with higher error rate in performance critical applications. Other aspects are improved flash chip architectures that allows data transfers between controller and flash chip concurrently with read and program operations, thus accelerating complex data operations, like data relocation (garbage collection) and Write-Read Back-Verify, typical for systems with high error rate memory.

The various aspects of the present invention are applicable to non-volatile memory systems in general. Although the description below, as well as that in the Background, is given mainly in terms of an EEPROM Flash memory embodiment, the particular type of storage unit used in the memory array is not particularly important in the present invention. The particulars of how the storage elements are read, are written, and store data do not enter in to the main aspects of the present invention and can be those of any of the various non-volatile systems.

In a first embodiment, the invention describes the method of pipelined relocation of multiple data portions, when integrity check and error correction of current data portion is done concurrently with programming of the previous data portion. When multiple pages (or data portions) are being relocated from one memory location to another (inside a chip or from one chip to another) the system always reads one data page in advance. After the advance page is read, the system starts programming the previously read page. While the previously read page is being programmed the system checks the data integrity of the advance read page and corrects the error if necessary and transfers it back to the flash memory buffer. Thus, as the data check and correction happens simultaneously with the previous page programming there is no time penalty in the case of system with high error rate unless the error correction takes longer than a page programming operation. So the data relocation pipelining hides error correction operations and the systems no longer has additional performance penalty when there is a read error. The system then can use a memory with much higher error rate without compromising the performance.

In an architecture providing a mechanism for internal, on-chip, pipelining of complex data operations such as Write-Read Back-Verify, an exemplary flash/EEPROM memory chip has two independent data buffers, where each buffer can be used for data access by the user while the other is used for program or read operations of data to or from the memory cell array. Every buffer has a capacity of up to one memory page and can be used by individual data transfer commands Read Buffer and Write. The above data transfer commands can be executed simultaneously with flash memory being programmed or read. The read and program commands are also specific for each buffer.

Flash Memory Architectures

FIGS. 5-8 show various architectures that are both aspects of the present invention themselves and allow other aspects of the present invention to be implemented. Each of these Figures shows a memory system including a controller 111 having one or more data buffers (111, 111a, 111b) connected to a memory 131 having an array 133 of non-volatile memory cells and one or more data registers (135, 135a, 135b). The terms "buffer" and "register" can be taken as largely synonymous here, but to make the discuss easier to follow, the present discussion will largely use the convention that "buffer" refers to a buffer or register on the controller, while "register" refers to a buffer or register on the memory. (More accurately, the term "buffer" usually refers to a part of RAM, or array of RAM cells, while "Register" is usually used for a set of latches or D-type registers. The exemplary embodiment of the present invention does use RAM buffers in the controller and sets of latched in the memory, consist with the use herein. In other embodiments, buffers can be used instead of registers and vice versa. More specifically, in the present description, the term "register" or "data register" on the memory will refer to a non-volatile or other element capable of holding data for sufficient time to allow the needed transfer. This can be a non-volatile or other element than can hold the data, if needed, for an extended time, or for only a very short time (on the order of nanoseconds).) As developed in the following section further, the architectures of FIGS. 5-8 allow for the pipelining of read and write operations with advantages such as data relocation methods that allows correction of data errors without any penalty to overall performance. Although prior art memories have presented systems allowing for the pipelining of multiple read operations or the pipelining of multiple write operations, they have not allowed the sort of pipelining of read and write operations found in the present invention.

For example, a read process is composed of two phases, from the array to the register, then from the register to the buffer on the controller; similarly, a write process has two phases, from the buffer controller to the register on the chip, then from the register into the array. By interleaving the phases from one process with the phases from the other process, the write are read operations have become pipelined.

The exemplary memory systems uses two data registers or buffers to organize the data relocation pipelining. Two of the possible hardware (or logical) architectures are shown in FIGS. 5 and 6. FIGS. 5 and 6 are block diagrams showing some elements of a non-volatile memory such as that in FIGS. 1 and 2. The other elements are suppressed in FIGS. 5 and 6, as well as FIGS. 7 and 8, in order to simplify the discussion, but are shown in more detail in, for example, U.S. patent application Ser. Nos. 09/505,555 and 09/703,083 incorporated by reference above.

The first system of FIG. 5 can use a conventional memory chip with a single data register for both read and write operations. In this case, the controller 101 has two data buffers, 111-A and 111-B, as is described in commonly assigned co-pending U.S. patent application Ser. No. 10/081,375, "Pipelined Parallel Programming Operation in a Non-Volatile Memory System", filed Feb. 22, 2002, which is hereby incorporated by reference. Although both controller buffers are each labeled as "Sector Buffer" as these typically are designed to a sector of data, other capacities can be used. (In FIGS. 5-8, a single memory 131 is shown, corresponding to one of the memories shown in FIG. 2. More generally, the system will contain a number of memory sections such as 131, but which are not shown here to simplify the discussion.)

The parts of the memory chip 131 explicitly shown in FIG. 5 include the data storage area 133, sense amplifiers 137, and the data register 135. (In practice, data register 135 may consist of multiple registers, connected in a master-slave arrangement.) Data register 135 is shown schematically connected to both of the sector buffers 111-A and 111-B through respective bus 141. The data register 135 will typically communicate with both sector buffers over the same bus from the chip that is then multiplexed between the two buffers 111-A and 111-B in the controller 101, even though the use of independent buses is possible. The data register 135 is then connected to sense amp 137 along path 145.

The second system, which is another aspect invention, is illustrated in FIG. 6. It uses a memory chip 131 with two independent data registers 135-A and 135-B. In this case, the controller 101 needs only one data buffer 111 for data integrity check and error correction, although the twin sector buffers in the controller of FIG. 5 can be combined with the twin data registers of FIG. 6 in another variation of the described embodiments. This exemplary embodiment will be discussed further below with respect to FIG. 7, which represents a number of the aspects shown in FIG. 6. As shown in FIG. 6, registers 135-A and 135-B can individually exchange data with memory array 131 over respective paths 145*a* and 145*b* and can individually exchange data with controller 111 over respective paths 143*a* and 143*b*. As discussed further below with respect to FIG. 7, which represents a number of the aspects shown in FIG. 6 in more detail, having the two sets of independent paths from the pair of data registers 135-A and 135-B are independent aspects of the present invention which may or may not be combined, depending on the embodiment. In practice the controller 101 will typically communicate with both data registers over the same bus from the chip which is then multiplexed between the two data registers 135-A and 135-B in the memory 131, even though the use of independent buses is possible.

The system of FIG. 6 as described above schematically can be designed on a basis of flash memory architecture utilizing two data registers. The architecture is illustrated in FIG. 7. FIG. 7 again suppresses other elements shown in FIGS. 1 and 2, such as error correction and data verification capabilities, which are discussed in more detail in, for example, U.S. patent application Ser. Nos. 09/505,555 and 09/703,083 incorporated by reference above. FIG. 7 shows a memory chip 131 with memory array 133, data registers 135-A and 135-B, and sense amplifiers 137 and a controller 101 with data buffer 111. Data registers 135-A and 135-B are respectively connectable to the controller 101 by paths 143*a* and 143*b* to the bus 141 that connects the controller to the memory, are respectively connectable to the memory array 133 by paths 143*a* and 143*b*, and are connectable to each other via 149.

The data paths 143*a* and 145*b* are new channels to be added to adopt the improved architecture on the basis of the existing architectures with two data registers. Although the use of more than one data register on a memory is known in the prior art, as in some of the references incorporated above or in U.S. Pat. No. 6,560,143, which is hereby incorporated by reference, these are not known to be connectable for independent data transfer to both the controller (through bus 141) and the memory array. For example, a typical prior art structure would use a master-slave arrangement with only register 135-B directly connectable to the controller and register 135-A to the memory array, so that, for example, in a programming operation, data from the controller would be assembled in register 135-B and then passed on through 149 to register 135-A, from which it would be programmed into the array.

As both of registers 135-A and 135-B can be independently connected, for example through a multiplexers (not shown), to the sense amplifier 137 and memory array 133 as well as through bus 141 to controller buffer 111, concurrent transfers of one set of data between either of these registers and the memory while another set of data can concurrently be transferred from the other register off the memory and into the controller. Once a set of data is transferred into the controller's buffer, error correction, write verify (as discussed below), or other operations can be performed on it there. The number of such registers could similarly be extended to more than two.

(By concurrent read and write processes, what is meant is that the autonomous read and write commands will overlap. In some cases, this can result in the read and write processes performed in parallel; however, as this is not allowed in many memory systems, more generally it is taken to mean that the autonomous read and write commands overlap with a single controller command covering both. For example, the command for the concurrent read and write would be issued by the controller and, in response, the programming starts, but is postponed for the read, then the program continues as directed by the state machine. In the sequences described below, if the concurrent read and program operations are not possible, then the read should be done first. In another variation, the read process can interrupt programming.)

The new data paths 143a and 145b are independent aspects that can individually be incorporated. The processes of FIGS. 13 and 14 are both based on the architecture of FIG. 7, however FIG. 14 does not rely upon path 143a, while FIG. 13 does not rely upon path 149.

FIG. 8 shows an alternate embodiment, which is structured similarly to FIG. 7 but lacks the additional data paths 143a and 145b so that only data register 2 135-B is directly connectable to bus 141 and only data register 1 135-A is directly connectable to the sense amplifiers 137 and memory array 133. In this way, the structure of FIG. 8 is also similar to two register embodiments found in the prior art; where FIG. 8 differs from the prior art is that it is structured allow a data swap along data path 149 of the contents of register 1 135-A with those of register 2 135-B, as indicated by the arrows. This data swap capability allows the embodiment of FIG. 8 to function equivalently to the embodiment of FIG. 7 in many respects, as is described below with respect to FIG. 15. More specifically, the architecture of FIG. 8 again allows for time required for the process of transferring of data to the controller, checking and correcting it there, and transferring it back to the memory to be largely hidden. The swap of register contents can be a special command from the controller or part of a composite command, such as read/swap/write. The swap capability can be implemented in many different ways including the case of two shift data registers, or a third temporary data element, as illustrated on the diagram 12 (OCC-2).

Pipelined Data Relocation Operations

FIGS. 9 and 10 illustrate the general concept of pipelining data relocation operations, with the example of FIG. 9 based on a memory without the architectural improvements described in the preceding section and with FIG. 10 using these improvements. The process of FIG. 9 reads one page ahead and does the error detection and correction in background. The diagram shows an implementation that be executed in the memory of FIG. 1, without using the new architectural features described in the patent. By reading ahead and rearranging the steps of FIG. 1, the process of FIG. 9 allows the error correction and detection phase (EC) for one data set to be hidden behind other processes. (Additionally, in both FIG. 9 and the other embodiments, the "wait" time, during which one data set is being transferred between the controller and the memory (and which is not shown in the figures), can also be used for the correction of data.) On FIG. 9 example, as well as the following examples, the page data transfers, page data error detection and correction operations, or both, can be split into a group of smaller data portion transfers and error detection and correction operations. This can be done for convenience in the configurations with more than one sector (host data portion) per page. In this case, the data is transferred by one portion at the time, which is then checked for integrity and corrected if necessary; subsequently, depending on architecture, the correct data can either be transferred back immediately or by waiting until all the page data is checked.

FIG. 10 again illustrates an on-chip copy sequence that reads a page ahead and does the error detection and correction in background using features of the new architectures. The diagram shows an implementation which uses a memory that allows flash reads and data transfers from data register during programming. As shown, this allows many of the steps in the relocation of one set of data to be hidden behind the programming of the preceding data set. Note that by pipelining reads and writes on the controller side of the system, the rate of data relocation is much improved with respect to the prior art process of FIG. 3. This is now described in more detail for the various architectural improvements.

In one aspect of the present invention, this allows a read process to be performed in parallel with a write process. The read process is taken to include a first read phase of transferring data from the non-volatile storage section to a first data registers and a second read phase of transferring data from the first data register to a data buffer. The write process is taken to include a first write phase of transferring data from a data buffer to a second of the data registers and a second write phase of transferring data from the second data register to the non-volatile storage section. According to this aspect of the present invention, the phases of the read and write processes can be interleaved with one another.

In another aspect of the present invention, the present invention presents a method comprising sequentially performing in a pipelined manner a plurality of data relocation operations. Each data relocation operations sequentially comprising the sub-operations of: reading a data set from the storage section to a data register; transferring the data set to the controller; checking/correcting the data set; transferring the data set back to one of the data registers; and programming the data back to the storage section, wherein the checking/correcting of the data set for one data relocation operation is performed concurrently with a sub-operation of the following data relocation operation.

For any of the embodiments, the data transferred out of the chip to the controller for the data integrity check and error correction are typically kept in the source data register. Consequently, when the data has no error, or minor error that is acceptable, and do not need to be corrected, there is no need to transfer the data back from the controller's buffer to the source data register since the data is already on the memory. Also, similar architectural elements can be used in more complex architectures with more than two data registers and other data storage elements.

FIGS. 13-15 show some of the basic operations using the architectures described. These basic pieces can be combined into more complex version. For example, the swap operation of FIGS. 8 and 15 could be combined with the additional paths of FIG. 7 and even with the multiple buffers in the controller shown in FIG. 5. As is often the case, it is a design choice balancing the question of complexity against the relative additional gains.

FIG. 11 shows the various elementary operations that are combined into the processes of FIGS. 13-15, 17, and 18. The first pair of Figures in FIG. 11 show the reading of a data set (Page n) from memory array 133 to Data Register A 135-A using path 145a or 145 and to Data Register B 135-B using path 145b, operations denoted as FA(n) and FB(n) respectively, where the notation is an abbreviation of Flash page(n) read to register A or B). The second pair of Figures in FIG. 11 show the programming of a data set (Page m) to memory array 133 from Data Register A 135-A using path 145a or 145 and from Data Register B 135-B using path 145b, operations denoted as PA(m) and PB(M) respectively. (Although the read page and write page are taken to be the same size here for ease of discussion, the can differ in the more general case.)

The third pair shows a transfer into each of the registers A and B from the buffer 111 through 143a and 143b (or 141), respectively, which are denoted LA and LB. The next pair is the transfer in the other direction, from each of the registers A and B to the buffer 111 through 143a and 143b (or 141), respectively labeled RA and RB. Again, the transfers can be done by smaller portions.

The last row shows transfers between the two registers through 149 (used in FIGS. 14 and 15, but not 13) and a swap operation using 149, which is an aspect of the present invention based on the embodiment of FIG. 8 (shown in FIG. 15). The copy from A to B is denoted CAB, the copy from B to A is denoted CBA, and the swap operation is denoted SW.

The operations specific to the different memory architectures can be summarized by referring to FIG. 12. The first diagram in FIG. 12 shows a prior art embodiment with two registers, but where only one of the registers can exchange data with the memory and only the other register can exchange data with the controller. Any transfer between the controller and the memory must also involve a transfer between the registers. The second diagram (OCC-1a) in FIG. 12 adds the ability to transfer data between either data register and the buffer (or buffers) of the controller and will used in the embodiment described with respect to FIG. 13. The third diagram (OCC-1b) in FIG. 12 allows both data registers to directly exchange data with the memory array and will used in the embodiment described with respect to FIG. 14. The last diagram (OCC-2) in FIG. 12 allows a data swap between the registers and will used in the embodiment described with respect to FIG. 14. The swap capability can be implemented in many different ways including the case of two shift data registers, or a third temporary data storage element.

Each of FIGS. 13-15 shows a data relocation operation for three pages of data, where in each case the data is transferred to the controller to be checked and corrected as needed before being transferred back to the memory for reprogramming. In the prior art, this would correspond to the process of FIG. 3. As will be seen; after the first data set, in each case the time needed to transfer each data set to and from the controller and check it there can be hidden behind the programming of the preceding data set. (Here, as with the other cases, it should be noted that the data may not need correction, in which case the check and correct process is reduced to just a data check. Further, if the data is acceptable without correction, it need not be transferred back as the copy already on the memory can be used.) This results in same amount of time as in the process of FIG. 4, where the data was not checked/corrected. Further, in some cases, the time need to read the data set from the memory array into a register can also be hidden.

FIG. 13 shows an on-chip copy sequence with data checking and correction using the feature of FIG. 7 that allows independent access to both data registers. The top portion of FIG. 13 shows the process in a format similar to FIGS. 3 and 4, but with the notation of FIG. 11. The numbers above correspond to the different phases shown below under the corresponding number using the notation from FIG. 11 with the process occurring in each page indicated underneath.

The process starts with the first page being processed through all the steps, with data page n read to register B, then transferred to the controller, in which (denoted by the broken line) it is checked (E) and sent back to register B, from which it is programmed into location m. As the controller can also access register A directly, once page n is read into register B, page (n+1) can be read into register A and, once the first page of data is returned and the bus to the controller is open, transferred to the controller, checked/corrected, and sent back to register A (if the data have been corrected). This allows for the entire data checking process for second data page to be hidden behind the programming of first data page. Similarly, the transfer out, check/correct, and transfer back of the third page is hidden behind the programming of the second data page. If the process were shown for additional pages, it can be seen that this pattern would continue, so that for each page after the first, the time required to check the data of one page is hidden behind the programming of the previous page. Consequently, after the first set, only time needed to read out the page to a register and write it back to its new location is seen. This results in the data checking advantages found in FIG. 3 of the prior art, but needing only the time for data relocation without out the correction process. Note that in this basic form, data is not transferred between the registers using path 149.

FIG. 14 shows an on chip copy sequence where data can be read from the memory to register B in parallel with writing data from register A to the memory. This basic version does not require the independent access to register A by the controller, nor assume the ability to read data from the memory to register A or the ability to program from register B. The process for the first page is similar to that in FIG. 13, except that in this basic implementation the page is copied into register A (CBA) for programming back into location m. As data can be read from the memory to register B concurrently with data being programmed from register A to the memory, as shown in copy phase 5, once the first page of data has been transferred to register A, both the programming of the first page and the reading out of the second page can start. For memories where read and program operations cannot be truly parallel, it is preferable that the read should be done first, or program operation can be interrupted by read, and then resumed. FIG. 14 illustrates an optimal case where read and program are parallel, but in this is not essential. More important is the ability to do those reads and writes independently, without disturbing the neighboring data register's data. Of course, the sooner the read operation is complete and the data can be transferred to the host, the better.

Because of this parallelism, the reading of the second page of data, its transferal to the controller, checking and correction, and transferal back to register B can all be hidden behind the programming of the first data page. (The relative times for each processes are not to scale, but their relative durations are typical of the processes in an actual flash memory device. Should the duration of an error correction process exceed that of the concurrent programming process (say due to using another memory technology), it will not be totally masked, but only the excess duration will be seen.) Similarly, the read, transfer out, check/correct, and transfer back for each subsequent page will be hidden behind the programming of the preceding page. Consequently, after the first page, only the time for the copy to buffer A and the programming back to the memory will be seen. If the independent access to register A is added, the buffer-to-buffer copy time can also be removed.

With respect to the process of FIG. 14, as noted above in the discussion of FIG. 7, what is meant by at least a portion of reading second data being performed concurrently with writing first data is that the autonomous read and write commands will overlap. In some cases, this can result in the read and write processes performed in parallel; however, as this is not allowed in many memory systems, more generally "concurrently" is taken to mean that the autonomous read and write commands overlap with a single controller command covering both, although in principle, the controller can control the sequence by more than one command. (In this example, the sequence for the $2^{nd}$ Page data can be FB(n+1) (read before program case), PA(m) (start programming), RB, E, and finally LB if necessary.) For example, the command for the concurrent read and write would be issued by the controller and, in response, the programming starts, but is postponed for the read, then the program continues as directed by the state machine. In the sequences described below, if the concurrent read and program operations are not possible, then the read should be done first. In another variation, the read process can interrupt programming.

FIG. 15 shows an on-chip copy sequence using the swap feature of FIG. 8 that allows the content of the data registers to be exchanged. In this basic version using the swap aspect of the present invention, data is exchanged directly only between memory array and data register A, and only data register B can be accessed directly by the controller. As previously noted, the swap operation can be combined with these other aspects of the present invention in order to extend the basic, exemplary embodiments of FIGS. 13-15.

For the first data page, the data set is read out to register A (FA(n)), copied to register B (CAB), transferred out to the controller (RB), checked/corrected (E), and loaded back into register B (LB). At copy phase 5, the next data page is read out to register A (FA(n+1)). (If the aspect of the present invention allowing concurrent transfer from register B and writing to register A, this second read can already have been performed.) At this point a swap (SW) is performed to exchange the content of the two registers in response to controller, either as part of a specific swap command or as part of a composite command. The first data page can then be written back to the memory while the second page goes through the check/correction process. Similarly, for each subsequent data page, the transfers between the memory and the controller and the data check/correction process are hidden between the preceding page's reprogramming. Consequently, aside from the first page being relocated, only the time to read, swap, and reprogram each page is seen.

FIG. 16 shows an embodiment of the present invention based upon the architecture of FIG. 5, where the controller has two data buffers. This is a simple copy sequence with read and write cache, where the data is checked/corrected before programming and uses the same notation as that of FIGS. 3 and 4. Since there are two buffers in the controller, while the data set in one buffer is undergoing the check/correct process, the other buffer can be used to transfer data between the controller and the memory. As shown in FIG. 16, the data check and correction process (E) can be hidden behind these transfers RB and WB. Further, a number of the controller-memory transfers can be partially (for RB behind R) or completely (for WB behind Program) hidden. Consequently, even without the additional connections of FIG. 7 or the swap operation of FIG. 8, a number of the sub-operations in data relocation process can be pipelined to increase performance. In particular, the data check and correct process (as in FIG. 16) and as well as the transfer to and from the controller (as in FIGS. 13-15) can be hidden behind other processes.

FIGS. 17 and 18 isolate aspects of the present invention that may used in an embodiment based on the architecture of FIG. 5 and presents them as in FIGS. 13-15, but without using the improved architectures of those figures. Of course these aspects may be combined with the described architectural improvements to further improve the pipelined data relocation process.

FIG. 17 shows a pipelined on-chip copy sequence using the architecture of FIG. 5, with a single data register and a controller buffer that could hold two data units. This arrangement allows the data in one buffer to be checked and corrected while another page of data transfers form the other buffer back to the register. For example, while the second page of data is being checked (E), the first data page is transferred back to the memory (LA). The third page can then be read to the free buffer (RA) so that it can be checked while the second page is transferred back (LA) to the memory for writing.

FIG. 18 adds a second register to the memory, but still within the prior art architecture. This allows for a further increase in performance as more operations can be hidden. For example, the reading the first data page from the buffer to the controller (RB) can be hidden behind the reading of the second page into register A (FA(n+1)), and the transfer back of the second data page (LB) is hidden behind the programming of the first data page (PA(m)).

As noted above, the various aspects of the different embodiments can be combined to further improve performance. For instance, allowing the controller independent access to both data registers (as in FIG. 13) with parallel read and write operations (as in FIG. 14), the register to register copy (CBA) operation of FIG. 14 can be eliminated. The result is shown in FIG. 19.

Except for being programmed to its new location (Program), the time need for all of the subsequent steps for DATA 2 are masked by the time for writing DATA 1 to its new location, and the time need for all of the subsequent steps for DATA 3 are masked by the time for writing DATA 2 to its new location. As can be seen in FIG. 19, after the first data set, only the time to read each data set from the memory array 133 to one of the registers 135-A or -B and write it back to the memory array is seen. All transfers to and from the controller, as well as any operations the controller performs on the data, are hidden. This is a significant savings over the prior art and also an improvement on the prior art processes of FIG. 3. As only the read and program time is seen, aside from the first data set, the pipelined process of FIG. 19 including error correction takes the less time than is shown in FIG. 4 for the prior art's simple read and rewrite data relocation scheme without a data integrity check and correction performed entirely on the memory chip.

Write-Read Back-Verify Operation

Although discussed so far in the context of error correction processes performed during the data relocation of a garbage collection routine, another operation that benefits from the improved flash chip architecture is Write-Read back-Verify operation. The prior art systems, such as shown in FIG. 1, utilize the sequence of flash memory commands shown in FIG. 20 to provide multiple Write-Read Back-Verify operations. In FIG. 20, for a given unit of data to written, the page must first be transferred from the controller to the data register 404 and then programmed into the memory array 400 (the Write Buffer and Program Page portions, respectively). To verify the result of the programming, the just programmed contents must be read back out into the data register (Read Page), transferred back to the controller (Read Buffer), and verified by the controller (Verify Data). Having only a single register available for data transfers between itself and the controller, each page of data must go through this process sequentially.

The system of FIG. 7, which uses the improved memory chip architecture featuring two independent buffers, can use the two data buffers to pipeline multiple Write-Read Back-Verify operations. (As with the data relocation operation, the alternate embodiment of FIG. 8 can similarly be used by including the register swap operation.) The pipelined sequence of operation is illustrated in FIG. 21.

As shown in FIG. 21, by having two registers, either of which can be used to transfer data between both the controller and the memory array, a page of data can be written from one of the registers 135-A and -B to the array 133 while the other has its contents transferred to the controller and verified there. This allows the transfer of one data page to the controller and its verification to occur there while the subsequent page of data is programmed into the array and, if the additional time is needed, read back. The saving of time in the Write-Read Back-Verify operations can be seen by comparing FIGS. 20 and 21.

Additional Modifications

In the case of a multi sector per page memory all the above sequences can be modified to reduce number of reads and programs. For example, when doing a pipelined data relocation, the system verifies and corrects more than one sector stored in one data register. The same optimization can be done for the Write-Read Back-Verify Operation. Also, if a memory design does not allow concurrent read and program operations then the above sequences should be modified so that the read operation is done before the programming of the data in the other buffer.

The various diagrams above show the basic operations of the exemplary embodiments and it will be understood that appropriate variations will result. For example, the timing sequences allocate the same amount of time error detection and correction. For many typical processes, many data sets will have no, or acceptable amounts, of error and will only requiring checking and no correction. For applications where a higher degree of data integrity can be assumed, the error correction and detection can be skipped some or all of the time.

The discussion so far has only considered the controller and a single memory chip in any detail. The various embodiments can be extended to more explicitly take account of the multiple memory chips in the same system, as shown in FIG. 2. This includes both on-chip data relocation for more than one chip, as shown in FIG. 22, as well as data relocation from one chip to another, as shown in FIG. 23. This discussion applies to both distinct chips and semi-autonomous arrays, or planes, formed on the same chip.

FIG. 22 shows one example of a chip-to-chip copy sequence that reads one page ahead and does the error correction and detection in the background before transferring the data to the second chip where it will be written. The example of FIG. 22 is based on the controller architecture of FIG. 5 with two data buffers on the controller. In case of a program failure, systems frequently retain data in the buffer in case it is needed for a program retry. Due to the incorporation of this feature, the writing of the buffer (RB) for the third and fourth data sets are delayed in order to retain the earlier data sets (the first and second data sets, respectively). This is shown in FIG. 22 by the arrows between the end of programming for the first data set and RB for the third data set, and similarly for the second and fourth data sets. Alternately, this sequence can be done with a single controller data buffer; then, in case of error, the data should be re-read again from the source. In any case, after the first data set, all of the steps except program are hidden behind the write process of the preceding data set.

FIG. 23 again takes accounts of multiple chips, but by pipelining the on-chip copy process for two different chips, where the data relocation on each chip is itself pipelined. (Note that in this case, for each chip, the data is relocated to a different location on the same chip, whereas in FIG. 22 the data was relocated from a first chip to a second chip. Also, if the physical chips can be operated/controlled as the equivalent of a bigger single chip, then all the previous sequences apply.) On each chip, the data relocation is as in FIG. 14, with the read-to-data-register-B in parallel with program from Register A pipelined copy occurring in each chip. This is repeated in the top of FIG. 23 for a single chip, with the bottom portion of FIG. 14 repeated at the bottom of FIG. 23.

Although the embodiment of FIG. 23 is based on an extension of FIG. 14 to two chips, the other single chip embodiments can similarly be extended to multiple chips.

The middle portion of FIG. 23 shows the process performed for three pages in a first chip (Chip 0, above the line) pipelined with that in a second chip (Chip 1, below the line). The middle diagrams are in an abbreviated form as show by the data lines between the top portion and chip 0 in the middle portion: The notation "R+E+Xf" (Read, Error check and correct, transfer) refers to the combined steps of FB, RB, E, and LB and the notation "Program" here refers to the combination of CBA and PA. As shown in the middle portion of FIG. 23, when one chip is busy programming and does not have any data in the controller, the other chip can execute the combined steps of the R+E+Xf process. This allows the data relocation in the two chips (which themselves are pipelined) to be pipelined with each other, where the arrows again indicate various time dependencies that need to be observed. This can be extended to more than two chips, although after a certain point the gains of using multiple chips start to be lost by slowing the process with each of the individual chips.

In FIG. 23, the various data sets (1st page, 2nd page, . . . ) may be distinct pages on each chip, if for example two parallel garbage collection operations are going on in two chips handled by the same controller; that is, the 1st Data Page in chip 0 is unrelated to the 1st Data Page in chip 1. Perhaps more commonly, a given data set will be related in the multiple chips, for example corresponding to the same logical construct. That is, the data, say 1st Page Data, spans across both chips on a per page basis. This occurs when a metablock spans multiple chips, as described in more detail in U.S. patent application Ser. No. 10/750,157, filed Dec. 30, 2003, which is hereby incorporated by reference.

When a given page of data spanning multiple chips is relocated, it is relocated in all these chips and 1st Page Data on both of chip 0 and chip 1 can follow the process of FIG. 23. This results in the overlapping of programming processes on the two chips as well as overlapping the data transfer and correction processes with programming on the same chip and across chips.

As mentioned above, although the discussion so far has referred mainly to embodiments using a charge-storing device, such as floating gate EEPROM or FLASH cells, for the memory device, it can be applied to other embodiments, including magnetic and optical media. As the particulars of how the storage elements are read, are written, and store data do not enter into the main aspects of the present invention, the various aspects of the present invention may be applied to other memory types, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and Pat. No. 5,892,706 of Shimizu et al., all of which are hereby incorporated herein by this reference, could also be used.

Although the invention has been described with respect to various exemplary embodiments, it will be understood that the invention is entitled to protection within the full scope of the appended claims.

It is claimed:

1. A memory system, comprising:
   a controller; and
   a memory, including:
      a non-volatile data storage section; and first and second data registers to temporarily store data, wherein first data can be transferred between either one of the data registers and the controller concurrently with transferring second data between the other one of the data registers and the non-volatile data storage section.

2. The memory system of claim 1, wherein said with transferring second data between the other one of the data registers and the non-volatile data storage section is a transfer to the non-volatile data storage section and the first data can additionally be transferred to said either one of the data registers from the non-volatile data storage section concurrently with the transferring second data.

3. The memory system of claim 2, wherein the memory exchanges the contents of the first data register with the contents of the second data register in response to a command from the controller.

4. The memory system of claim 1, wherein the memory exchanges the contents of the first data register with the contents of the second data register in response to a command from the controller.

5. The memory system of any of claims 1-4, wherein the second data can be operated upon in the controller concurrently with transferring the first data between said one of the data registers and the non-volatile data storage section.

6. The memory system of claim 5, wherein the controller includes error correction circuitry and the controller can perform error correction operations upon the second data concurrently with transferring the first data between said one of the data registers and the non-volatile data storage section.

7. The memory system of claim 5, wherein the controller can perform data verification operations upon the second data concurrently with transferring the first data between said one of the data registers and the non-volatile data storage section.

8. The memory system of claim 1, wherein said controller includes a plurality of data buffers and wherein the controller can perform a data checking operation on the contents of a first of said data buffers concurrently with transferring data between another of said data buffers and said memory.

9. The memory system of claim 8, wherein said data checking operation is an error detection and correction operation.

10. The memory system of claim 8, wherein said data checking operation is program-verify operation.

11. A method of operating a memory system comprising a controller and a memory including first and second data registers and a non-volatile data storage section, the method comprising:
  determining one of said data registers for the transfer of data between the controller and the memory;
  transferring first data between the memory array and the other of said data registers; and
  transferring second data between said determined one of the data registers and the controller, wherein at least a portion of the transferring second data is performed concurrently with said transferring first data.

12. The method of claim 11, wherein said first data is read from the memory into said other of said data registers.

13. The method of claim 11, wherein said first data is programmed from said other of said data registers into the memory.

14. The method of either of claims 11 and 13, wherein said second data is transferred from the controller.

15. The method of either of claims 11-13, wherein said second data is transferred to the controller.

16. The method of claim 15, further comprising, subsequent to transferring the second data to the controller:
  checking/correcting the second data by the controller.

17. The method of claim 16, wherein said checking/correcting the second data comprises:
  determining the quality of the second data; and
  in response to said determining the quality of the second data, correcting the second data,
the method further comprising:
  transferring back the corrected second data from the controller to said determined one of the data registers, wherein the checking/correcting and the transferring back the second data is performed concurrently with said transferring first data.

* * * * *